(12) United States Patent
Lee et al.

(10) Patent No.: US 12,004,405 B2
(45) Date of Patent: *Jun. 4, 2024

(54) DISPLAY DEVICE AND METHOD OF FABRICATING THE SAME

(71) Applicant: SAMSUNG DISPLAY CO., LTD., Yongin-si (KR)

(72) Inventors: Donghyun Lee, Asan-si (KR); Si Joon Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/058,724

(22) Filed: Nov. 23, 2022

(65) Prior Publication Data

US 2023/0088708 A1 Mar. 23, 2023

Related U.S. Application Data

(63) Continuation of application No. 17/363,834, filed on Jun. 30, 2021, now Pat. No. 11,515,370.

(30) Foreign Application Priority Data

Oct. 13, 2020 (KR) ........................ 10-2020-0131763

(51) Int. Cl.
| | | |
|---|---|---|
| *G06F 3/044* | (2006.01) | |
| *G06F 3/041* | (2006.01) | |
| *H10K 59/40* | (2023.01) | |
| *H10K 71/00* | (2023.01) | |

(52) U.S. Cl.
CPC ............ *H10K 59/40* (2023.02); *G06F 3/0412* (2013.01); *G06F 3/0443* (2019.05); *H10K 71/00* (2023.02)

(58) Field of Classification Search
None
See application file for complete search history.

(56) References Cited

U.S. PATENT DOCUMENTS

| | | |
|---|---|---|
| 10,281,780 B2 | 5/2019 | Furuta |
| 10,566,554 B2 | 2/2020 | Li et al. |
| 11,204,663 B2 | 12/2021 | Lee et al. |
| 11,379,069 B2 | 7/2022 | Ma et al. |
| | (Continued) | |

FOREIGN PATENT DOCUMENTS

| | | |
|---|---|---|
| JP | 3-215992 A | 9/1991 |
| JP | 6-283850 A | 10/1994 |
| | (Continued) | |

*Primary Examiner* — Duane N Taylor, Jr.
(74) *Attorney, Agent, or Firm* — Lewis Roca Rothgerber Christie LLP

(57) ABSTRACT

A display device may include a display panel including a first substrate, a second substrate on the first substrate, and a light-emitting device between the first substrate and the second substrate, an input sensing portion including a sensing electrode on the second substrate and a first pad connected to the sensing electrode, a first circuit film near a side surface of the display panel adjacent to the first pad, the first circuit film including a first contact pad spaced from the first pad, a first conductive layer on the first pad, the first conductive layer being extended to the first contact pad to electrically connect the first pad to the first contact pad, and a protection layer on the first conductive layer.

20 Claims, 25 Drawing Sheets

(56) References Cited

U.S. PATENT DOCUMENTS

| | | |
|---|---|---|
| 2017/0255314 A1 | 9/2017 | Choi |
| 2020/0021008 A1* | 1/2020 | Yong .................... H01Q 21/005 |
| 2021/0359072 A1 | 11/2021 | Lee et al. |

FOREIGN PATENT DOCUMENTS

| | | |
|---|---|---|
| KR | 10-0205947 B1 | 7/1999 |
| KR | 10-1993340 B1 | 6/2019 |
| KR | 10-2021-0142805 | 11/2021 |

* cited by examiner

DISPLAY DEVICE AND METHOD OF FABRICATING THE SAME

CROSS-REFERENCE TO RELATED APPLICATIONS

This application is a continuation of U.S. patent application Ser. No. 17/363,834, filed Jun. 30, 2021, which claims priority to and the benefit of Korean Patent Application No. 10-2020-0131763, filed Oct. 13, 2020, the entire content of both of which is incorporated herein by reference.

BACKGROUND

1. Field

The present disclosure relates to a display device and a method of fabricating the same.

2. Description of Related Art

In general, a display device includes a display panel including a plurality of pixels, which are used to display an image, a gate driver providing gate signals to the pixels, and a data driver providing data voltages to the pixels. The gate driver and the data driver may be connected to the display panel.

The gate driver generates the gate signals and provides the generated gate signals to the pixels. The data driver generates the data voltages and provides the generated data voltages to the pixels. The pixels display the image using the data voltages, in response to the gate signals.

A region, in which the gate driver and the data driver are disposed, is defined as a bezel region. Recently, a technology of connecting the gate driver and the data driver to a side surface of the display panel is being developed to reduce an area of the bezel region.

SUMMARY

Aspects of one or more embodiments of the present disclosure are directed towards a display device with a reduced bezel region and a method of reducing process time and process cost in a process of fabricating the display device.

According to an embodiment of the present disclosure, a display device may include a display panel including a first substrate, a second substrate on the first substrate, and a light-emitting device between the first substrate and the second substrate, an input sensing portion including a sensing electrode on the second substrate and a first pad connected to the sensing electrode, a first circuit film near a side surface of the display panel adjacent to the first pad, the first circuit film including a first contact pad spaced from the first pad, a first conductive layer on the first pad, the first conductive layer being extended to the first contact pad to electrically connect the first pad to the first contact pad, and a protection layer on the first conductive layer.

The protection layer may cover the first conductive layer, the protection layer being on a portion of the first pad adjacent to the first conductive layer and on the first contact pad adjacent to the first conductive layer.

The first conductive layer may include a metal powder.

The display device may further include a first adhesive layer between the display panel and the first contact pad. The first conductive layer may be between the first pad and the first contact pad, the first conductive layer being on the first adhesive layer.

The first conductive layer may be in contact with a top surface of the first pad. A top surface of the first adhesive layer may be between the first pad and the first contact pad. A side surface of the first contact pad may face a side surface of the first pad.

The first contact pad may face the side surface of the display panel. The first contact pad may protrude upwardly relative to the second substrate.

A side surface of the first pad may overlap the side surface of the display panel in a plan view.

A thickness of the first conductive layer may increase along a direction from the first pad toward the first contact pad.

The display device may further include a second circuit film including a second contact pad facing a side surface of the first substrate, a second pad on the first substrate, a second adhesive layer between the side surface of the first substrate and the second contact pad, and a second conductive layer on the second pad, the second conductive layer being extended to the second contact pad to electrically connect the second pad to the second contact pad.

A top surface of the first contact pad may be below a top surface of the second substrate.

The first pad may be spaced from a side surface of the second substrate. The second substrate may have an inclined surface connecting the side surface of the second substrate to a top surface of the second substrate The display device may further include a second circuit film including a second contact pad facing a side surface of the first substrate, a deposition metal layer on the side surface of the first substrate and on a bottom surface of the first substrate adjacent to the side surface of the first substrate, a second adhesive layer between the deposition metal layer and the second contact pad, and a second conductive layer below the deposition metal layer, the second conductive layer being extended to the second contact pad to electrically connect the deposition metal layer to the second contact pad.

The display device may further include a deposition metal layer on the first pad, the deposition metal layer being extended to the side surface of the display panel and to a bottom surface of the display panel adjacent to the side surface of the display panel. The first conductive layer may be below the deposition metal layer, the first conductive layer being extended to the first contact pad to electrically connect the first pad to the first contact pad.

The display device may further include a second circuit film below the first substrate, the second circuit film including a second contact pad protruding outwardly relative to a side surface of the first substrate, a deposition metal layer on the side surface of the first substrate, and a second conductive layer on the deposition metal layer and on the second contact pad to electrically connect the deposition metal layer to the second contact pad.

The display device may further include a deposition metal layer on the first pad, the deposition metal layer being extended to the side surface of the display panel. The first circuit film may be below the first substrate. The first contact pad may be outwardly extended relative to a side surface of the first substrate. The first conductive layer may be on the deposition metal layer and the first contact pad.

According to an embodiment of the present disclosure, a method of fabricating a display device may include preparing a display panel including a first substrate, a second substrate on the first substrate, and a light-emitting device between the first substrate and the second substrate, providing a sensing electrode on the second substrate and a first pad connected to the sensing electrode, providing a first circuit film facing a side surface of the display panel adjacent to the first pad, the first circuit film including a first contact pad spaced from the first pad, and spraying a metal powder onto the first pad and the first contact pad to form a first conductive layer connecting the first pad to the first contact pad. The metal powder may not be provided directly on (e.g., may not be provided on or may not be provided in contact with) an insulating layer around the first pad.

The spraying the metal powder onto the first pad and the first contact pad to form the first conductive layer may include providing a protection layer on the first conductive layer. The protection layer may cover the first conductive layer.

The metal powder may be deposited on the first pad and the first contact pad by a physical impact of the metal powder and by impact heat produced by the physical impact.

The spraying the metal powder onto the first pad and the first contact pad to form the first conductive layer may further include forming a first adhesive layer between the side surface of the display panel and the first contact pad.

The first conductive layer may be provided on a top surface of the first pad, a top surface of the first adhesive layer between the first pad and the first contact pad, and a side surface of the first contact pad facing the side surface of the first pad.

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1:
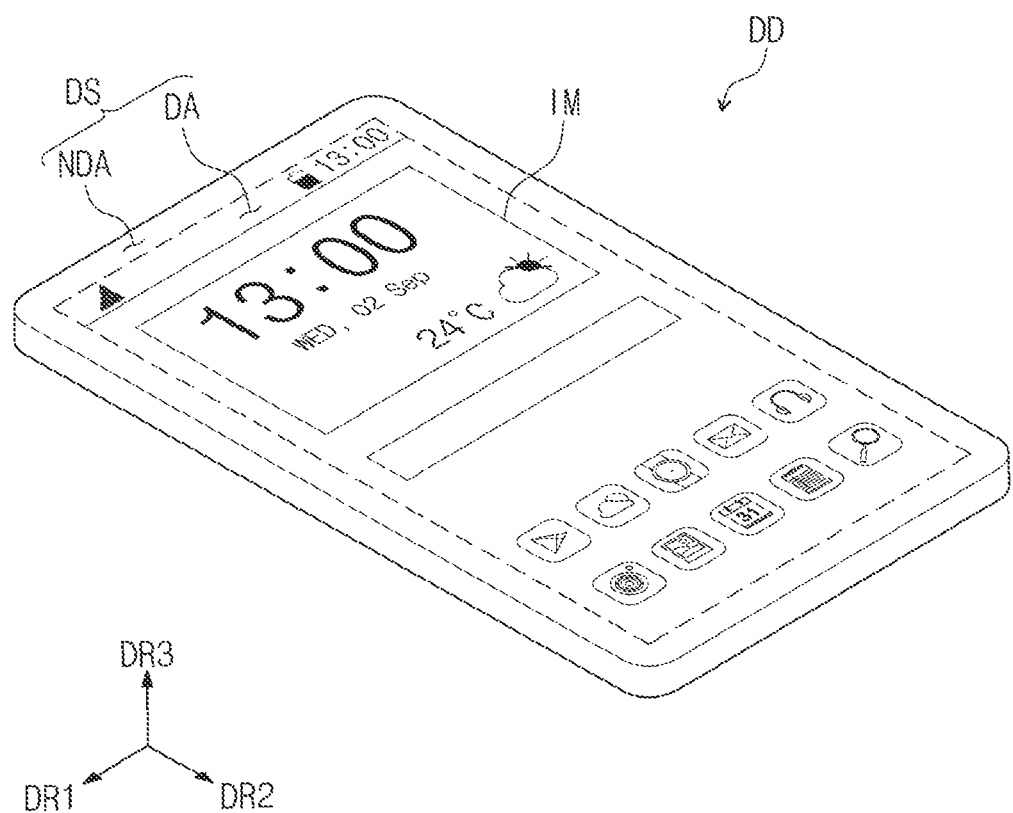
FIG. 1 is a perspective view illustrating a display device according to an embodiment of the present disclosure.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the present disclosure will now be described more fully with reference to the accompanying drawings, in which embodiments are shown. Embodiments of the present disclosure may, however, be embodied in many different forms and should not be construed as being limited to the embodiments set forth herein; rather, these embodiments are provided so that this disclosure will be thorough and complete, and will fully convey the spirit and scope of the present disclosure to those of ordinary skill in the art. In the drawings, the thicknesses of layers and regions are exaggerated for clarity. Like reference numerals in the drawings denote like elements, and thus duplicative descriptions thereof may not be provided.

It will be understood that when an element is referred to as being "on", "connected to" or "coupled to" another element or layer, it can be directly connected or coupled to the other element or layer or intervening elements or layers may be present. In contrast, when an element is referred to as being "directly on", "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the embodiments described herein. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements and/or components, but do not preclude the presence or addition of one or more other features, integers, steps, operations, elements, components and/or groups thereof.

Embodiments of the present disclosure are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

Unless otherwise defined, all terms (including technical and scientific terms) used herein have the same meaning as commonly understood by one of ordinary skill in the art to which this disclosure pertains. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the present disclosure will be explained in more detail with reference to the accompanying drawings.

FIG. 1 is a perspective view illustrating a display device according to an embodiment of the present disclosure.

Referring to FIG. 1, a display device DD according to an embodiment of the present disclosure may have a rectangular shape whose short sides are parallel to a first direction DR1 and whose long sides are parallel to a second direction DR2 crossing the first direction DR1. However, the present disclosure is not limited to this example, and in an embodiment, the display device DD may have various suitable shapes such as circular and polygonal shapes.

Hereinafter, a direction, which is substantially perpendicular or normal to both of the first and second directions DR1 and DR2, will be referred to as a third direction DR3. Furthermore, in the present specification, the expression "in a plan view" may refer to viewing a relevant structure in the third direction DR3.

A top surface of the display device DD may be defined as a display surface DS and may have a flat surface that is parallel to both of the first and second directions DR1 and DR2 (e.g., parallel to a plane defined by the first and second directions DR1 and DR2). Images IM generated by the display device DD may be provided to a user through the display surface DS.

The display surface DS may include a display region DA and a non-display region NDA around or near the display region DA. The display region DA may be configured to display an image IM, and the non-display region NDA may not be used to display an image IM. The non-display region NDA may be disposed to enclose the display region DA and to define an edge of the display device DD, which is printed with a color (e.g., a specific color).

In an embodiment, the display device DD may be used as one of large-sized electronic devices (e.g., television sets, monitors, and outdoor billboards) or as a part thereof. In an embodiment, the display device DD may be used as one of small-sized and medium-sized electronic devices (e.g., personal computers, laptop computers, personal digital assistants, car navigation systems, game machines, smart phones, tablets, and cameras). However, it should be understood that the above-mentioned electronic devices are some examples according to embodiments of the present disclosure, and the display device DD may be used to realize other electronic devices without departing from the spirit and scope of the present disclosure.

Figure 2:
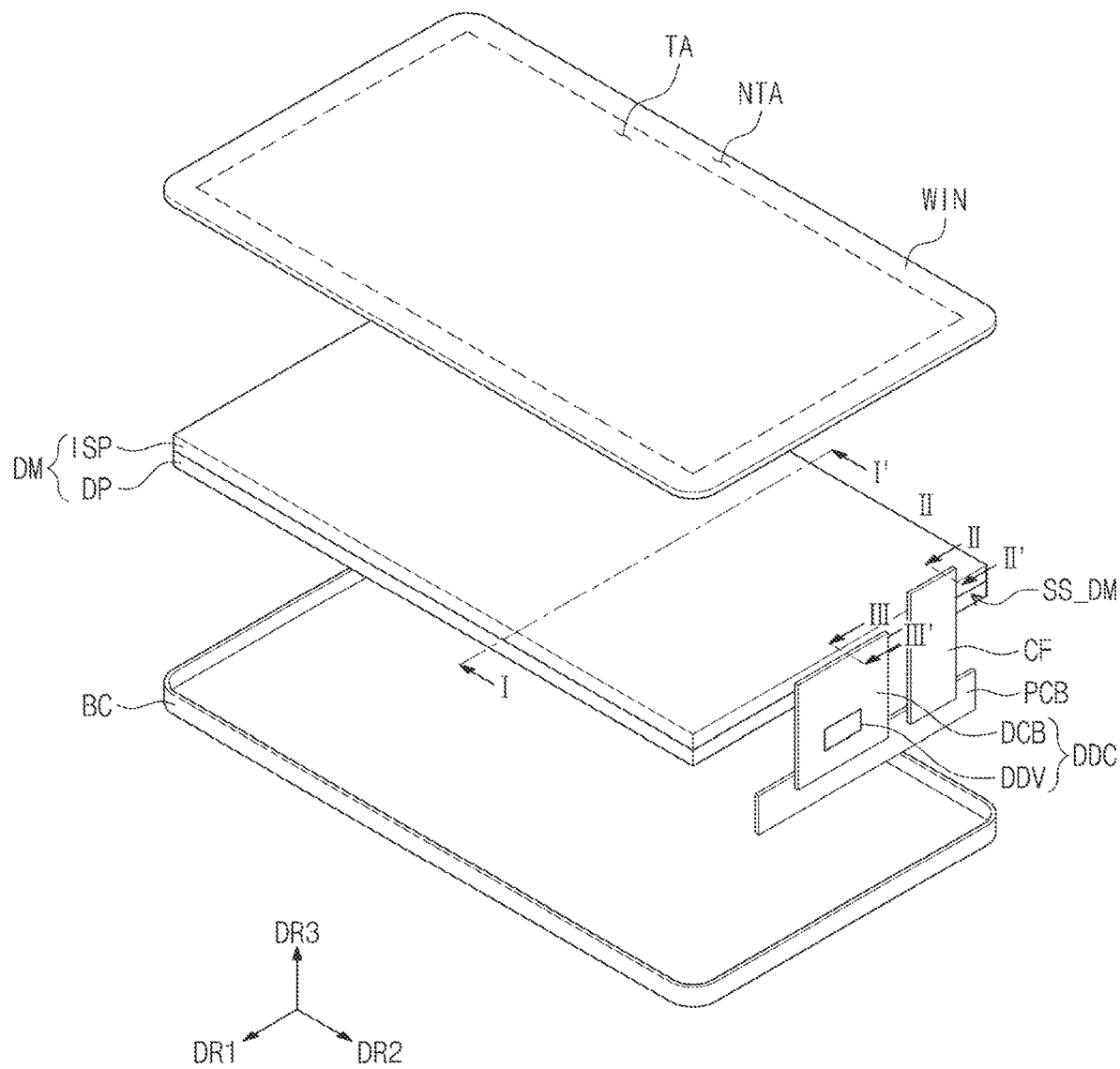
FIG. 2 is an exploded perspective view illustrating a display device according to an embodiment of the present disclosure.

FIG. 2 is an exploded perspective view illustrating a display device according to an embodiment of the present disclosure.

Referring to FIG. 2, the display device DD may include a window WIN, a display module DM, a first circuit film CF, a second circuit film DDC, a main circuit board PCB, and a containing member BC.

The window WIN may be disposed on the display module DM and may be configured to allow an image IM, which is provided from the display module DM, to be transmitted to the outside. The window WIN may include a transmission region TA and a non-transmission region NTA. The transmission region TA may be overlapped with the display region DA and may have a shape corresponding to the display region DA (e.g., see FIG. 1). The image IM displayed in the display region DA of the display device DD may pass through the transmission region TA of the window WIN and may be recognized by a user.

The window WIN may protect the display module DM from an external scratch or impact.

The non-transmission region NTA may be overlapped with the non-display region NDA and may have a shape corresponding to the non-display region NDA (e.g., see FIG. 1). The non-transmission region NTA may have relatively low optical transmittance, compared with (relative to) the transmission region TA. The non-transmission region NTA may be overlapped with a bezel region, which is defined in the non-display region NDA of the display device DD. However, in an embodiment, the non-transmission region NTA may be omitted.

The window WIN may be formed of or include an optically transparent insulating material. For example, the window WIN may be formed of or include at least one of glass and plastic materials. The window WIN may have a multi-layer structure or a single-layer structure. For example, the window WIN may include a plurality of plastic films, which are combined with (e.g., bonded to) each other by an adhesive material, or a glass substrate and a plastic film, which are combined with (e.g., bonded to) each other by an adhesive material.

The display module DM may be disposed between the window WIN and the containing member BC. The display module DM may be configured to display the image IM (e.g., see FIG. 1) and to sense an external input. The display module DM may include a display panel DP and an input sensing portion ISP.

The display panel DP may be an element substantially producing (e.g., providing) the image IM. The image IM, which is produced or provided by the display panel DP, may pass through the transmission region TA and may be recognized by a user.

In an embodiment, the display panel DP may be a light-emitting display panel, and the present disclosure is not limited to a specific type of light-emitting display panel DP. For example, the display panel DP may be an organic light-emitting display panel, a quantum dot light-emitting display panel, or a micro-LED display panel. A light-emitting layer of the organic light-emitting display panel may include an organic light-emitting material. A light-emitting layer of the quantum dot light-emitting display panel may include quantum dots and/or quantum rods. A light-emitting layer of the micro-LED display panel may include micro-LEDs. However, these are examples, and the type of the display panel DP according to embodiments of the present disclosure is not limited to these examples.

The input sensing portion ISP may be disposed on the display panel DP. The input sensing portion ISP may include a plurality of sensor units, which sense an external input in a capacitance manner. In the fabrication process of the display panel DP, the input sensing portion ISP may be fabricated on (e.g., directly fabricated on) the display panel DP. However, the present disclosure is not limited to this example, and the input sensing portion ISP may be fabricated as a panel, which is distinct from the display panel DP, and then may be attached to the display panel DP by an adhesive layer. This disposition of the input sensing portion ISP will be described in more detail with reference to FIGS. 3A and 3B.

The first and second circuit films CF and DDC and the main circuit board PCB may be disposed on a side surface SS_DM of the display module DM. According to an embodiment of the present disclosure, a dead space in the display device DD may be reduced, compared with (relative to) a dead space of a display device including a plurality of circuit films that are disposed on a top surface or a bottom surface of a display module. By using the first and second circuit films CF and DDC and the main circuit board PCB, an area of the non-display region NDA may be reduced. In other words, an area of the bezel region of the display device DD may be reduced.

The first circuit film CF may be connected (e.g., electrically connected) to the input sensing portion ISP. The first circuit film CF may connect the input sensing portion ISP to the main circuit board PCB.

The first circuit film CF may be joined to (e.g., connected to) pads (hereinafter, "first pads") of the input sensing portion ISP disposed in the non-display region NDA. The first circuit film CF may provide electrical signals, which are used to drive the input sensing portion ISP, to the input sensing portion ISP.

The second circuit film DDC may be connected (e.g., electrically connected) to the display panel DP. The second circuit film DDC may connect the display panel DP to the main circuit board PCB. The second circuit film DDC may be joined to (e.g., connected to) pads (hereinafter, "second pads") of the display panel DP disposed in the non-display region NDA.

The second circuit film DDC may include a display circuit board DCB and a data driver DDV. The data driver DDV may be disposed on the display circuit board DCB.

In an embodiment, the main circuit board PCB may include a timing controller for driving the display module DM, a touch driver for driving the input sensing portion ISP, a connector for power supply, and the like. Each of the first and second circuit films CF and DDC may be joined to (e.g., connected to) the main circuit board PCB. In an embodiment, the display module DM and the input sensing portion ISP may be controlled (e.g., easily controlled) through a single main circuit board PCB. However, the present disclosure is not limited to this example, and in the display module DM according to another embodiment, the display panel DP and the input sensing portion ISP may be connected to different main circuit boards, and one of the first circuit film CF and the second circuit film DDC may not be connected to the main circuit board PCB. For example, the first circuit film CF and the second circuit film DDC may be connected to different main circuit boards from each other. However, the present disclosure is not limited thereto.

The containing member BC may be combined with (e.g., coupled to) the window WIN. In an embodiment, the containing member BC may be combined with the window WIN to provide an internal space therebetween. The display module DM may be disposed in the internal space.

The containing member BC may be formed of or include a material with relatively high hardness. For example, the containing member BC may include at least one of glass, plastic, and metallic materials or may include a plurality of frames and/or plates that are made of the glass, plastic, or metallic materials. The containing member BC may protect (e.g., stably protect) components of the display device DD, which are disposed in the internal space, from an external impact.

Figure 3A:
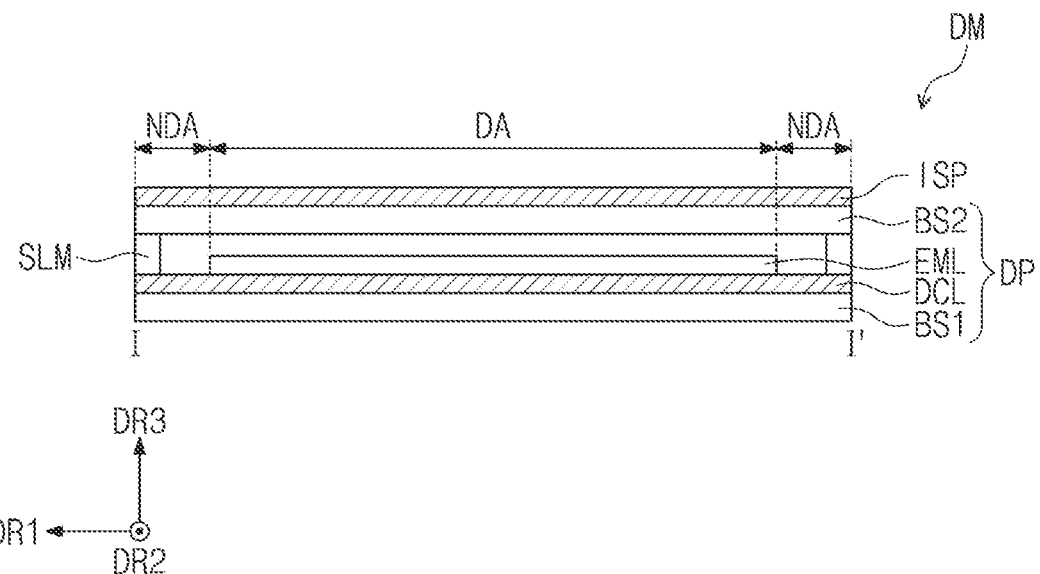
FIG. 3A is a cross-sectional view taken along the line I-I' of FIG. 2, according to an embodiment of the present disclosure.

FIG. 3A is a cross-sectional view taken along the line I-I' of FIG. 2, according to an embodiment of the present disclosure.

Referring to FIG. 3A, the display panel DP may include a first substrate BS1, a display circuit layer DCL disposed on the first substrate BS1, an image-display layer EML disposed on the display circuit layer DCL, a second substrate BS2 disposed on the image-display layer EML, and a sealant SLM disposed between the display circuit layer DCL and the second substrate BS2.

The input sensing portion ISP may be disposed on (e.g., directly disposed on) the display panel DP. For example, the input sensing portion ISP may be disposed on (e.g., directly disposed on) the second substrate BS2.

The first and second substrates BS1 and BS2 may include the display region DA and the non-display region NDA near or around the display region DA. Each of the first and second substrates BS1 and BS2 may be a silicon substrate, a plastic substrate, a glass substrate, an insulating film, or a stack including a plurality of insulating layers.

The image-display layer EML may be disposed in the display region DA. The image-display layer EML may include organic light-emitting diodes. However, the present disclosure is not limited to this example, in an embodiment, the image-display layer EML may include inorganic light-emitting diodes, organic-inorganic light-emitting diodes, or a liquid crystal layer.

A plurality of pixels may be disposed in the display circuit layer DCL and the image-display layer EML. Each of the pixels may include a transistor, which is disposed in the display circuit layer DCL, and a light-emitting device, which is disposed in the image-display layer EML and is connected to the transistor.

The second substrate BS2 may be disposed on the image-display layer EML. The sealant SLM may be disposed between the first and second substrates BS1 and BS2. The sealant SLM may be formed of or include (e.g., be) at least one of organic materials (e.g., photocurable or photoplastic resins) and inorganic materials (e.g., frit seal), but the present disclosure is not limited to these examples. The sealant SLM may be disposed in the non-display region NDA. The sealant SLM may be used to bond the first substrate BS1 to the second substrate BS2. The sealant SLM may seal the image-display layer EML between the first substrate BS1 and the second substrate BS2.

The second substrate BS2 may be disposed on the image-display layer EML. A space may be defined between the second substrate BS2 and the image-display layer EML. The space may be filled with air or an inert gas. In an embodiment, the space may be filled with a filling material (e.g., silicon-based polymers, epoxy-based resins, or acryl-based resins).

The input sensing portion ISP may include a plurality of insulating portions and a plurality of conductive portions. The conductive portions may be used as sensing electrodes, which are used to sense an external input, sensing lines, which are connected (e.g., electrically connected) to the sensing electrodes, and sensing pads, which are connected (e.g., electrically connected) to the sensing lines. A detailed structure of the input sensing portion ISP will be described in more detail with reference to FIG. 4.

Figure 3B:
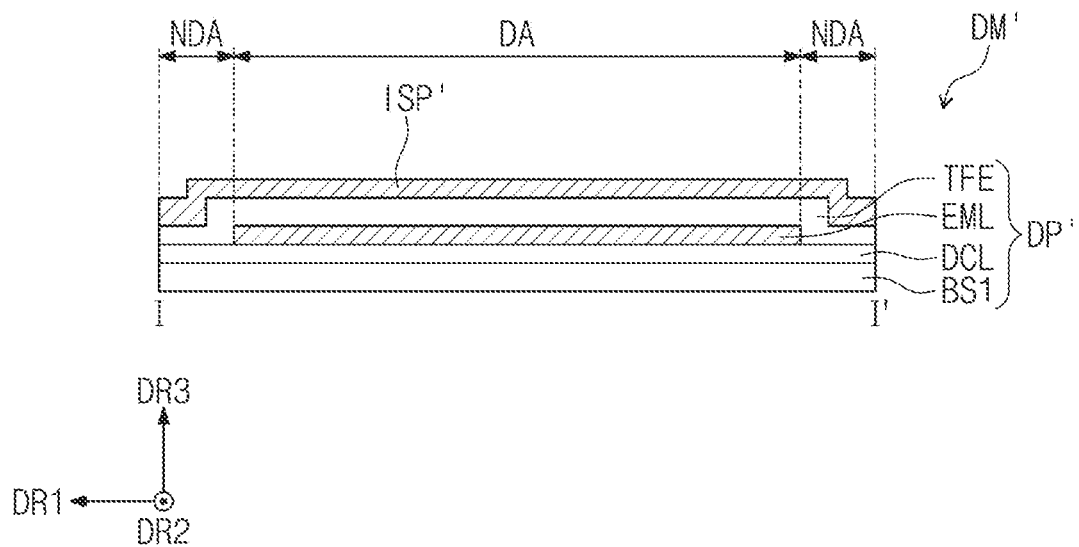
FIG. 3B is a cross-sectional view taken along the line I-I' of FIG. 2, according to another embodiment of the present disclosure.

FIG. 3B is a cross-sectional view taken along the line I-I' of FIG. 2, according to another embodiment of the present disclosure. In the following description of FIG. 3B, an element previously described with reference to FIG. 3A may be identified by the same reference number and a redundant description thereof may not be repeated for the sake of brevity.

Referring to FIG. 3B, a display module DM' may include a display panel DP' and an input sensing portion ISP'. Unlike the structure of FIG. 3A, a thin encapsulation layer TFE may be disposed on the display circuit layer DCL to cover the image-display layer EML. The thin encapsulation layer TFE may include inorganic layers and an organic layer between the inorganic layers. The inorganic layers may protect the pixels from moisture or oxygen. The organic layer may protect the pixels from a contamination material (or contaminant), such as dust particles.

The input sensing portion ISP' may be disposed on the thin encapsulation layer TFE. For example, the input sensing portion ISP' may be disposed on (e.g., directly disposed on) the thin encapsulation layer TFE. The input sensing portion ISP' may be fabricated on (e.g., directly fabricated on) the display panel DP', in a process of fabricating the display device DD.

Figure 4:
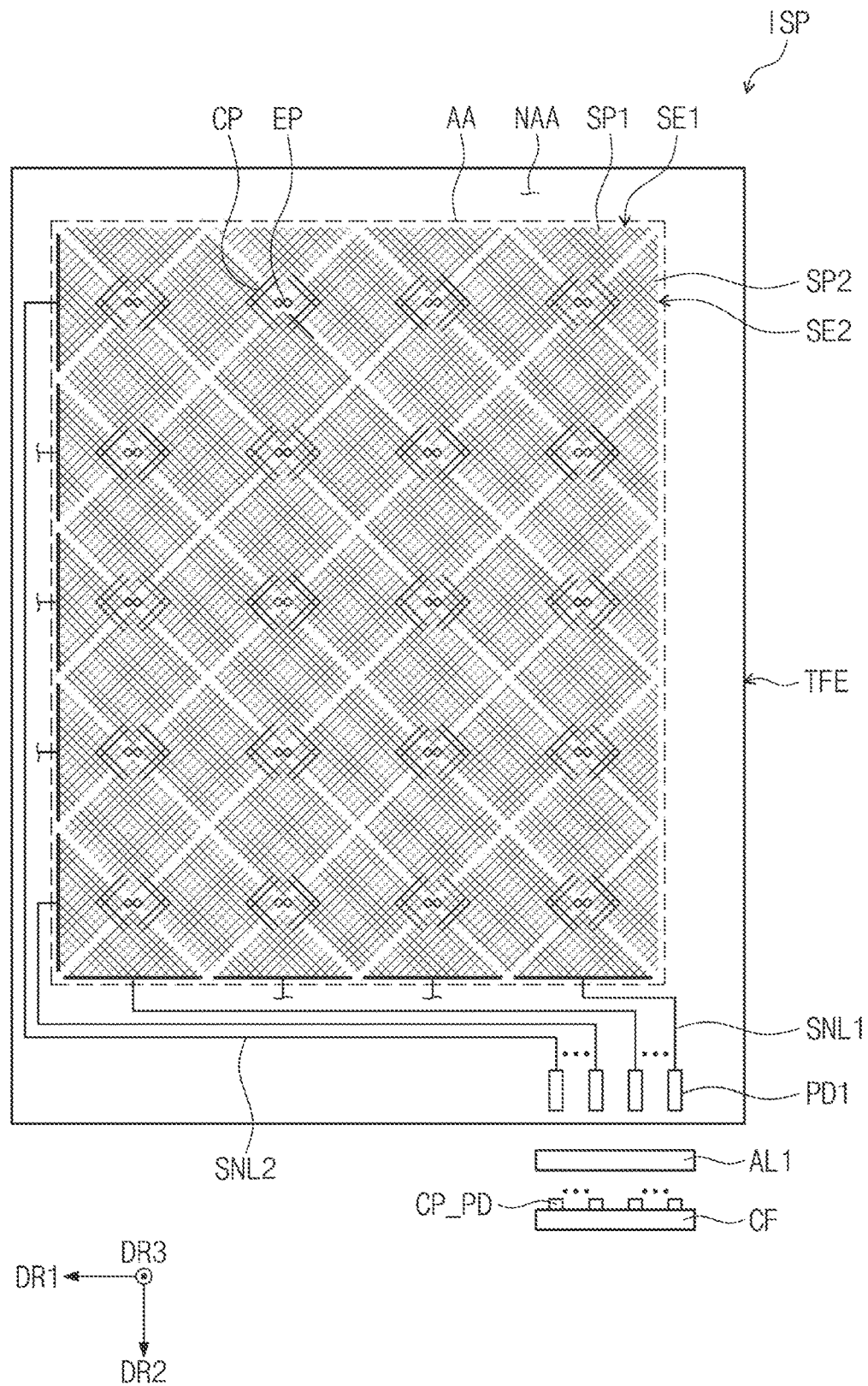
FIG. 4 is a plan view illustrating the input sensing portion of FIG. 2.

FIG. 4 is a plan view illustrating the input sensing portion of FIG. 2.

Referring to FIG. 4, the input sensing portion ISP may include a plurality of sensing electrodes SE1 and SE2, a plurality of sensing lines SNL1 and SNL2, and a plurality of first pads PD1. The sensing electrodes SE1 and SE2, the sensing lines SNL1 and SNL2, and the first pads PD1 may be disposed on the thin encapsulation layer TFE.

In a plan view, the input sensing portion ISP may include an active region AA and a non-active region NAA around or near the active region AA. The active region AA may be overlapped with the display region DA, and the non-active region NAA may be overlapped with the non-display region NDA. The sensing electrodes SE1 and SE2 may be disposed in the active region AA, and the first pads PD1 may be disposed in the non-active region NAA.

The sensing lines SNL1 and SNL2 may be connected to ends of the sensing electrodes SE1 and SE2 and may extend to the non-active region NAA to connect to the first pads PD1. The input sensing portion ISP may be connected to the first circuit film CF. For example, the first pads PD1 may be connected to first contact pads CP_PD disposed in the first circuit film CF. A first adhesive layer AL1 may be disposed between the input sensing portion ISP and the first circuit film CF. The first circuit film CF may be connected to the input sensing portion ISP by the first adhesive layer AL1. In more detail, the first contact pads CP_PD may be connected to the input sensing portion ISP by the first adhesive layer AL1.

When the first contact pads CP_PD are connected to the input sensing portion ISP, the first pads PD1 may be connected (e.g., electrically connected) to the first contact pads CP_PD through an additional conductive layer, and this structure will be described in more detail below.

The sensing electrodes SE1 and SE2 may include a plurality of first sensing electrodes SE1, which are extended in the second direction DR2 and are arranged along the first direction DR1, and a plurality of second sensing electrodes SE2, which are extended in the first direction DR1 and are arranged along the second direction DR2. The second sensing electrodes SE2 may be extended to cross the first sensing electrodes SE1 and may be electrically disconnected from the first sensing electrodes SE1.

The sensing lines SNL1 and SNL2 may include a plurality of first sensing lines SNL1, which are connected to the first sensing electrodes SE1, and a plurality of second sensing lines SNL2, which are connected to the second sensing electrodes SE2. The first sensing lines SNL1 and the second sensing lines SNL2 may be connected to the first pads PD1.

The first sensing electrodes SE1 may be defined as output sensing electrodes, and the second sensing electrodes SE2 may be defined as input sensing electrodes. The input sensing portion ISP may be operated in a mutual-sensing mode. In an embodiment, a touch driver of the main circuit board PCB may be connected to the input sensing portion ISP through the first circuit film CF. The first circuit film CF may provide electrical signals, which are used to drive the input sensing portion ISP, and may receive sensing signals from the input sensing portion ISP.

Each of the first sensing electrodes SE1 may include a plurality of first sensing portions SP1, which are arranged in the second direction DR2, and a plurality of connection patterns CP, which are provided to connect adjacent ones of the first sensing portions SP1 to each other. Each of the connection patterns CP may be disposed between a pair of the first sensing portions SP1, which are adjacent to each other in the second direction DR2, to connect the pair of the first sensing portions SP1 to each other.

Each of the second sensing electrodes SE2 may include a plurality of second sensing portions SP2, which are arranged in the first direction DR1, and a plurality of extension patterns EP, which are extended from the second sensing portions SP2. Each of the extension patterns EP may be disposed between a pair of the second sensing portions SP2, which are adjacent to each other in the first direction DR1, and may extend from the pair of the second sensing portions SP2. In an embodiment, each of the extension patterns EP may connect a pair of the second sensing portions SP2 to each other.

The first sensing portions SP1 and the second sensing portions SP2 may have a mesh shape. The first sensing portions SP1 and the second sensing portions SP2 may be spaced from each other (e.g., the first sensing portions SP1 and the second sensing portions SP2 may not overlap in a plan view) and may be alternately disposed with respect to each other. Capacitors may be formed by the first sensing portions SP1 and the second sensing portions SP2. The extension patterns EP may not be overlapped with the connection patterns CP in a plan view.

Figure 5:
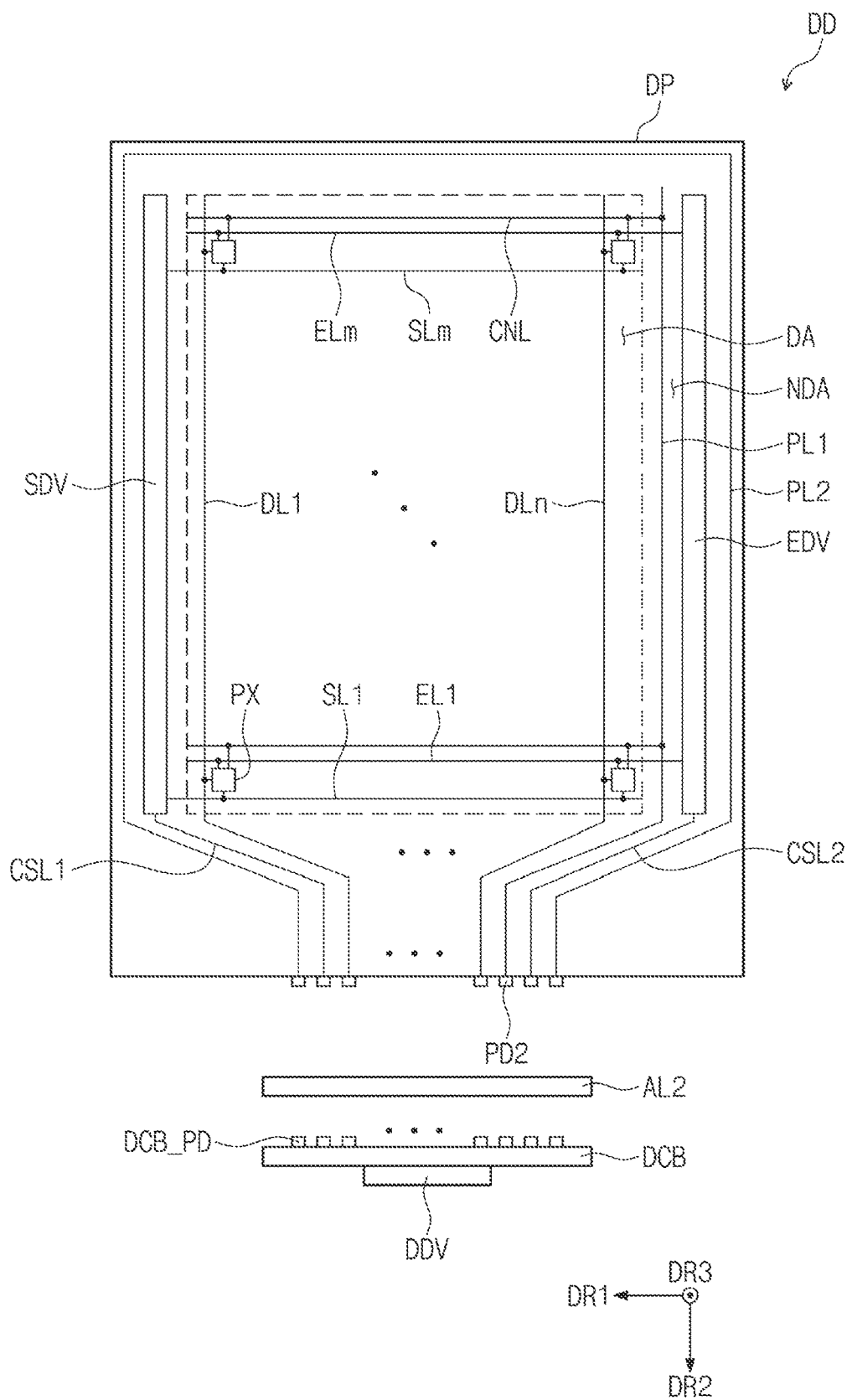
FIG. 5 is a plan view illustrating a structure of the display panel of FIG. 2.

FIG. 5 is a plan view illustrating a structure of the display panel of FIG. 2.

Referring to FIG. 5, the display device DD may include the display panel DP, a scan driver SDV, the data driver DDV, an emission driver EDV, the display circuit board DCB, and a second contact pad DCB_PD.

The display panel DP may have a rectangular shape whose long sides are parallel to the second direction DR2 and whose short sides are parallel to the first direction DR1, but the shape of the display panel DP is not limited to this example. The display panel DP may include a display region DA and a non-display region NDA surrounding or around the display region DA.

The display panel DP may include a plurality of pixels PX, a plurality of scan lines SL1-SLm, a plurality of data lines DL1-DLn, a plurality of emission lines EL1-ELm, first and second control lines CSL1 and CSL2, first and second power lines PL1 and PL2, connection lines CNL, and a plurality of the second pads PD2, where m and n are natural numbers.

The pixels PX may be disposed in the display region DA. The scan driver SDV and the emission driver EDV may be disposed at opposite portions (e.g., opposite sides) of the non-display region NDA, which are adjacent to respective long sides of the display panel DP.

The scan lines SL1-SLm may extend in the first direction DR1 and may be connected to the pixels PX and the scan driver SDV. The data lines DL1-DLn may extend in the second direction DR2 and may be connected to the pixels PX and the second pads PD2. The emission lines EL1-ELm may extend in the first direction DR1 and may be connected to the pixels PX and the emission driver EDV.

The first power line PL1 may extend in the second direction DR2 and may be disposed in the non-display region NDA. The first power line PL1 may be disposed between the display region DA and the emission driver EDV. However, the present disclosure is not limited to this example. For example, the first power line PL1 may be disposed between the display region DA and the scan driver SDV.

The connection lines CNL may be disposed in the display region DA, may extend in the first direction DR1, and may be arranged along the second direction DR2. The connection lines CNL may be connected to the first power line PL1 and the pixels PX. A first voltage may be provided to the pixels PX through the first power line PL1 and the connection lines CNL, which are connected to each other.

The second power line PL2 may be disposed in the non-display region NDA. The second power line PL2 may extend along (e.g., adjacent to) the long sides and one of the short sides of the display panel DP. The second power line PL2 may be disposed between the scan and emission drivers SDV and EDV and the long sides of the display panel DP and between the display region DA and one of the short sides of the display panel DP.

In an embodiment, although it is not illustrated in the drawings, the second power line PL2 may extend toward the display region DA and may be connected to the pixels PX. A second voltage, whose level is lower than the first voltage, may be applied to the pixels PX through the second power line PL2.

The first control line CSL1 may be connected to the scan driver SDV and may extend toward a bottom portion of the display panel DP in a plan view. The second control line CSL2 may be connected to the emission driver EDV and may extend toward the bottom portion of the display panel DP in a plan view.

The second pads PD2 may be disposed on the bottom portion of the display panel DP. The bottom portion of the display panel DP may be a side surface SS_DM of the display module DM shown in FIG. 2. The data lines DL1-DLn, the first power line PL1, the second power line PL2, the first control line CSL1, and the second control line CSL2 may be connected to corresponding ones of the second pads PD2.

The second circuit film DDC may connect the data lines DL1-DLn, the first power line PL1, the second power line PL2, the first control line CSL1, and the second control line CSL2 of the display panel DP to the main circuit board PCB.

The second contact pads DCB_PD may be arranged along the first direction DR1 and protrude in the second direction DR2. The second contact pads DCB_PD may be connected to corresponding ones of the second pads PD2. The data lines DL1-DLn may be connected to the data driver DDV through the second pads PD2 and the second contact pads DCB_PD corresponding thereto.

The scan driver SDV may produce a plurality of scan signals, in response to a scan control signal, and the scan signals may be applied to the pixels PX through the scan lines SL1-SLm. The data driver DDV may produce a plurality of data voltages corresponding to image signals, in response to a data control signal. The data voltages may be applied to the pixels PX through the data lines DL1-DLn. The emission driver EDV may produce a plurality of emission signals, in response to an emission control signal, and the emission signals may be applied to the pixels PX through the emission lines EL1-ELm.

The data driver DDV may be disposed on a surface of the display circuit board DCB, which is opposite to the surface that the second contact pad DCB_PD is on in the second direction DR2. In a plan view, the data driver DDV may be provided adjacent to a bottom portion of the display circuit board DCB.

A second adhesive layer AL2 may be disposed between the display panel DP and the display circuit board DCB. The second adhesive layer AL2 may include an anisotropic conductive film. The second pads PD2 and the second contact pads DCB_PD may be connected (e.g., electrically connected) to each other by the second adhesive layer AL2.

Figure 6:
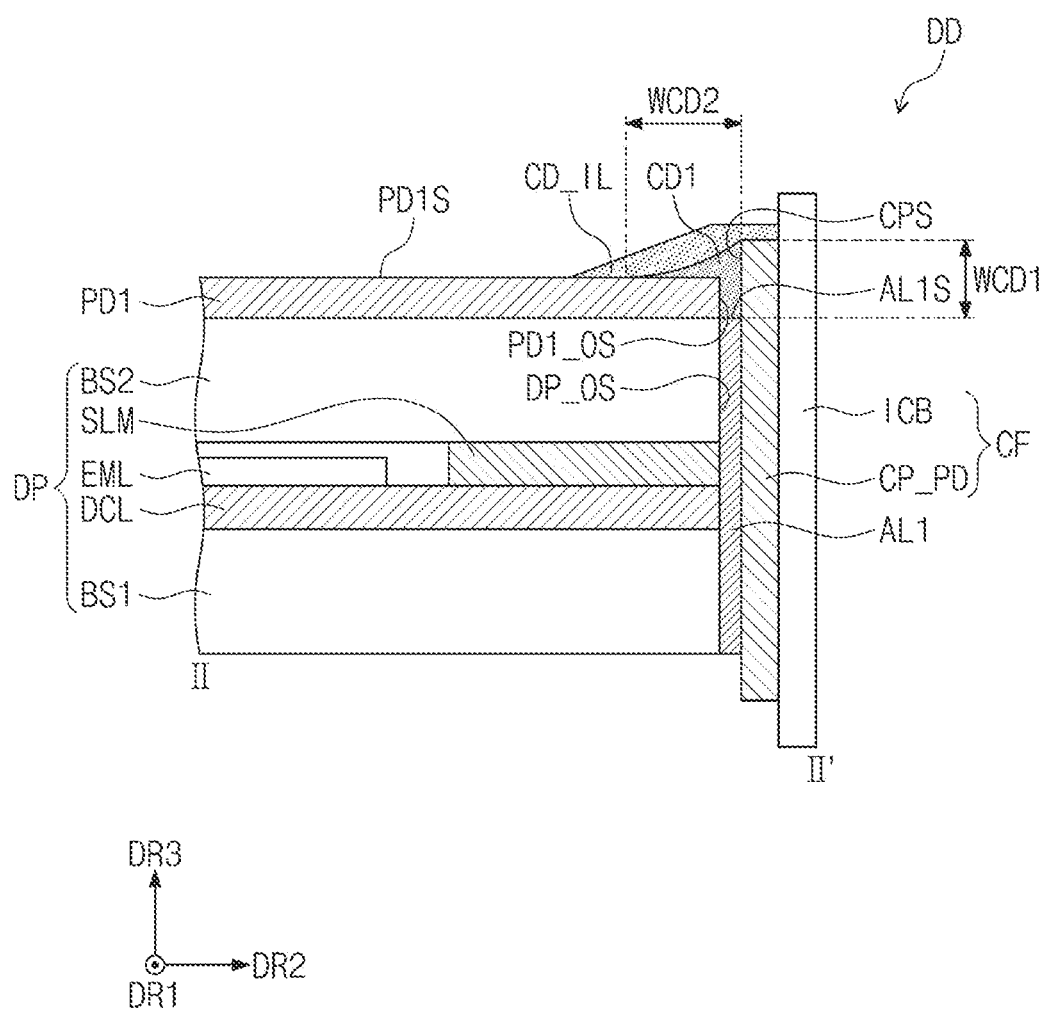
FIG. 6 is a cross-sectional view taken along the line II-II' of FIG. 2, according to an embodiment of the present disclosure.

FIG. 6 is a cross-sectional view taken along the line II-II' of FIG. 2, according to an embodiment of the present disclosure. In the following description of FIG. 6, an element previously described with reference to FIG. 3A may be identified by the same reference number and a redundant description thereof may not be repeated for the sake of brevity.

Referring to FIG. 6, the first pad PD1 may be disposed on a top surface of the second substrate BS2. In a plan view, a side surface PD1_OS of the first pad PD1 may be overlapped with a side surface DP_OS of the display panel DP. However, the present disclosure is not limited to this example, and in an embodiment, the side surface PD1_OS of the first pad PD1 may be spaced from the side surface DP_OS of the display panel DP by a distance (e.g., a specific distance) in a plan view.

The first pad PD1 may be a portion of the input sensing portion ISP. The first pad PD1 may be formed of or include the same material as the input sensing portion ISP. The first pad PD1 may be formed of or include at least one of indium tin oxide (ITO) and molybdenum (Mo). However, the material of the first pad PD1 is not limited to this example. For example, the first pad PD1 may have a multi-layer structure, in which titanium (Ti), aluminum (Al), and titanium (Ti) layers are sequentially stacked.

The first circuit film CF may include a first contact pad CP_PD and an input circuit board ICB. The first circuit film CF may be combined to (e.g., coupled to) a side surface of the display module DM.

The first contact pad CP_PD may have a rectangular shape whose short sides are parallel to the second direction DR2 and whose long sides are parallel to the third direction DR3 in the cross-sectional view. A width of the first contact pad CP_PD in the third direction DR3 may be larger (or greater) than a thickness of the display panel DP in the third direction DR3 and/or a thickness of the first pad PD1 in the third direction DR3.

A side surface CPS of the first contact pad CP_PD may face the side surface DP_OS of the display panel DP. The first contact pad CP_PD may protrude in the third direction DR3, compared with (relative to) the top surface of the second substrate BS2, and may be joined to (e.g., coupled to) a side surface DP_OS of the display panel DP. A length of a portion of the first contact pad CP_PD protruding above the top surface of the display panel DP will be referred to as a first distance WCD1. For example, the first contact pad CP_PD may protrude in the third direction DR3 by the first distance WCD1, compared with (relative to) the top surface of the second substrate BS2. The first distance WCD1 may range from several micrometers to several hundreds of micrometers. For example, the first distance WCD1 may be 70 μm to 80 μm, in consideration of an error in an attaching process. However, the protruding length of the first contact pad CP_PD is not limited thereto, and in an embodiment, the first contact pad CP_PD may not protrude in the third direction DR3, compared with (relative to) the top surface of the second substrate BS2.

The first contact pad CP_PD may be formed of or include tin (Sn) and/or copper (Cu). However, the material of the first contact pad CP_PD is not limited thereto.

The input circuit board ICB may have a rectangular shape whose short sides are parallel to the second direction DR2 and whose long sides are parallel to the third direction DR3 in the cross-sectional view. A width of the input circuit board ICB in the third direction DR3 may be larger (or greater) than the width of the first contact pad CP_PD in the third direction DR3.

The input circuit board ICB may be connected (e.g., electrically connected) to the first contact pad CP_PD. For example, the input circuit board ICB may be a flexible circuit board. The input circuit board ICB may be bent from the side surface of the display module DM to have a portion facing the bottom surface of the display module DM. However, the present disclosure is not limited to this example, and in an embodiment, the input circuit board ICB may be of a rigid type (e.g., a rigid circuit board).

The first adhesive layer AL1 may be disposed between the display module DM and the first contact pad CP_PD. The first adhesive layer AL1 may join a side surface of the first substrate BS1 of the display module DM, the side surface of a display circuit layer DCL, a side surface of the sealant SLM, and a side surface of the second substrate BS2, to a side surface CPS of the first contact pad CP_PD. The first adhesive layer AL1 may include at least one of resins, anisotropic conductive films, and non-conductive films. However, the present disclosure is not limited to this example, and in an embodiment, the first adhesive layer AL1 may include at least one of any suitable adhesive or gluing agent. For example, the first adhesive layer AL1 may include at least one of epoxy adhesives, urethane adhesives, and photo-curable resins.

A first conductive layer CD1 may be disposed on the side surface PD1_OS and a top surface PD1S of the first pad PD1, a top surface AL1S of the first adhesive layer AL1, and the side surface CPS of the first contact pad CP_PD. For example, the first conductive layer CD1 may contact the side surface PD1_OS and the top surface PD1S of the first pad PD1, the top surface AL1S of the first adhesive layer AL1, and the side surface CPS of the first contact pad CP_PD. The first conductive layer CD1 may be formed to have a length, which is equal to the first distance WCD1, in the third direction DR3 and a length, which is depicted as a second distance WCD2, in the second direction DR2. The second distance WCD2 may range from several micrometers to several tens of micrometers. However, the second distance WCD2 is not limited to this range. A thickness of the first conductive layer CD1 defined in the third direction DR3 may increase (e.g., gradually increase) when measured along a path or a direction from the first pad PD1 toward the first contact pad CP_PD. For example, the top surface of the first conductive layer CD1 may extend at an angle relative to the top surface PD1S of the first pad PD1. However, the thickness of the first conductive layer CD1 is not limited to this example and may be constant or vary when measured along a path or a direction from the first pad PD1 toward the first contact pad CP_PD.

The first conductive layer CD1 may be in contact with the first pad PD1 and the first contact pad CP_PD. The first conductive layer CD1 may connect (e.g., electrically connect) the first pad PD1 to the first contact pad CP_PD.

The first conductive layer CD1 may be a metal powder. The metal powder may contain a metallic material, such as copper (Cu) and/or aluminum (Al). The first conductive layer CD1 may be formed by a process of spraying the metal powder.

The metal powder, which is provided on the side surface PD1_OS and the top surface PD1S of the first pad PD1 and the side surface CPS of the first contact pad CP_PD, may facilitate the electrical connection between the first pad PD1 and the first contact pad CP_PD. However, the first conductive layer CD1 is not limited thereto and may be formed of or include at least one of various suitable conductive materials. For example, the first conductive layer CD1 may be formed of or include at least one of a metal ink, a metal paste, and a metal particle. The metal ink may include a metallic material and a solvent. The metal paste may include a metallic material, a binder, and a resin. The metal particle may be provided through a sputtering process or a jetting process.

A protection layer CD_IL may be disposed on the first conductive layer CD1. The protection layer CD_IL may cover a portion of a top surface PD1S of the first pad PD1, a top surface of the first conductive layer CD1, and a portion of a top surface of the first contact pad CP_PD. However, the present disclosure is not limited to this example, and in an embodiment, the protection layer CD_IL may cover the top surface PD1S of the first pad PD1, the top surface of the first conductive layer CD1, and the top surface of the first contact pad CP_PD.

The protection layer CD_IL may prevent two adjacent ones of the first conductive layers CD1 from being in contact with each other. Thus, a short circuit may be prevented or protected from being formed between adjacent ones of the first pads PD1. The protection layer CD_IL may be formed of or include at least one of insulating materials (e.g., acrylate, resin, epoxy, and urethane). However, the present disclosure is not limited to this example, and in an embodiment, the protection layer CD_IL may be formed of or include various suitable materials.

Figure 7:
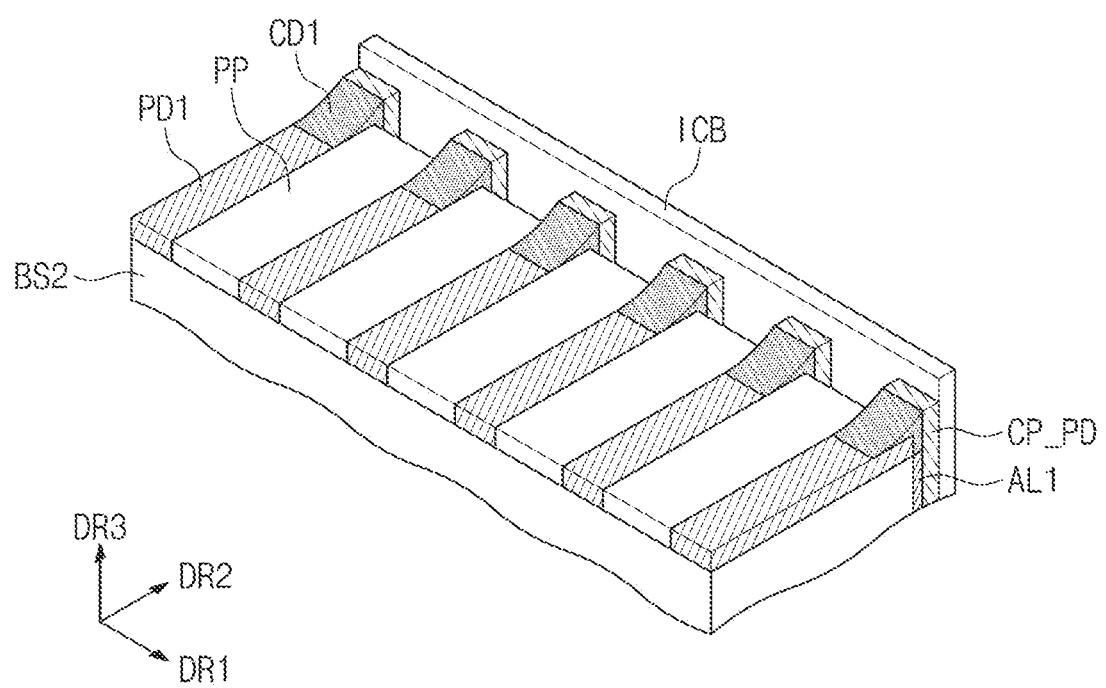
FIG. 7 is a perspective view exemplarily illustrating a first conductive layer connecting a first pad to a first contact pad, shown in FIG. 6.

FIG. 7 is a perspective view exemplarily illustrating a first conductive layer connecting a first pad to a first contact pad, shown in FIG. 6. For convenience in description and illustration, only the second substrate BS2 is illustrated as a part of the display panel DP.

Referring to FIG. 7, the first pads PD1 may have a rectangular shape whose short sides are parallel to the first direction DR1 and whose long sides are parallel to the second direction DR2 in a plan view. The first pads PD1 may be disposed on the top surface of the second substrate BS2 to be spaced from each other in the first direction DR1.

The first contact pads CP_PD may have a rectangular shape whose short sides are parallel to the first direction DR1 and whose long sides are parallel to the third direction DR3 in the cross-sectional view. The first contact pads CP_PD may be disposed on the side surface of the input circuit board ICB to be spaced from each other in the first direction DR1. The distance between the first contact pads CP_PD may correspond to (e.g., be equal to) the distance between the first pads PD1.

The side surface of the second substrate BS2 may be adjacent to the side surface of the input circuit board ICB. The side surface of the second substrate BS2 may be attached to the side surface of the first contact pad CP_PD by the first adhesive layer AL1.

The long side of the first pad PD1 may be perpendicular to the long side of the first contact pad CP_PD. The first pads PD1 may be spaced from, but adjacent to, the first contact pads CP_PD in the second direction DR2. However, the present disclosure is not limited to this example, and in an embodiment, the first pads PD1 may be in contact with the first contact pads CP_PD.

Each of the first conductive layers CD1 may be disposed on not only the top surface of the first pad PD1 but also the side surface of the first contact pad CP_PD. A contact area between the first pad PD1 and the first contact pad CP_PD may be increased by the first conductive layer CD1. Thus, a contact resistance between the first pads PD1 and the first contact pads CP_PD may be reduced. The first conductive layers CD1 may be spaced from each other in the first direction DR1 to prevent a short circuit from being formed therebetween.

Partition portions PP may be respectively disposed between the first pads PD1. The partition portions PP may have a rectangular shape whose short sides are parallel to the first direction DR1 and whose long sides area parallel to the second direction DR2 in a plan view. The partition portions PP may be formed of or include a flexible plastic material (e.g., polyimide (PI)). The partition portions PP may prevent one of the first pads PD1, which is connected to one of the first contact pads CP_PD through one of the first conductive layers CD1, from being in contact with another one of the first conductive layers CD1. Thus, a short circuit may be prevented or protected from being formed between adjacent ones of the first pads PD1 and adjacent ones of the first conductive layers CD1.

Figure 8:
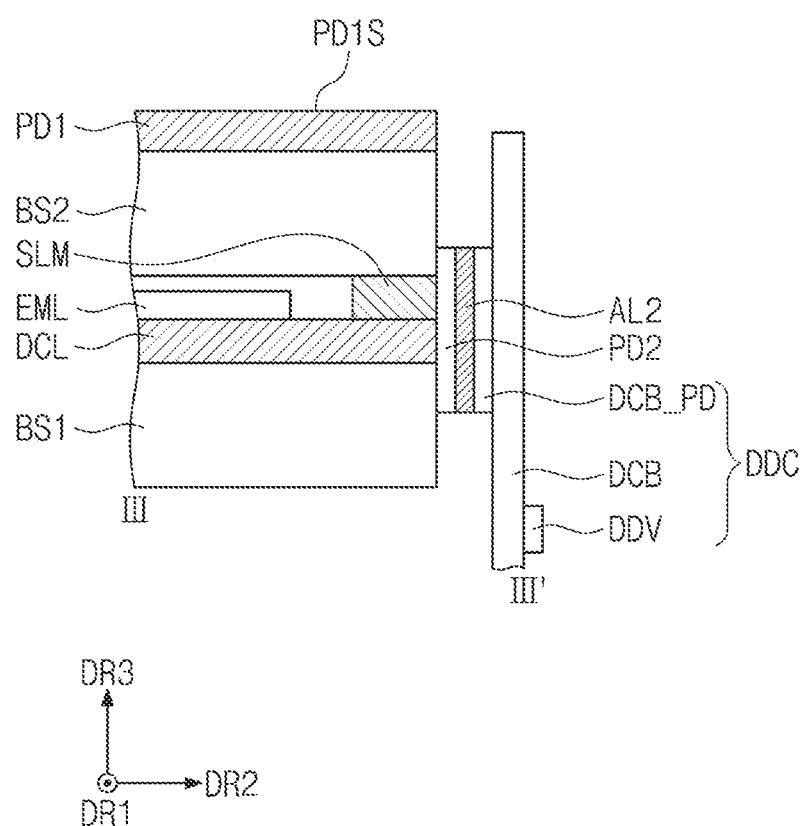
FIG. 8 is a cross-sectional view taken along the line III-III' of FIG. 2, according to an embodiment of the present disclosure.

FIG. 8 is a cross-sectional view taken along the line III-III' of FIG. 2, according to an embodiment of the present disclosure. In the following description of FIG. 8, an element previously described with reference to FIG. 3A may be identified by the same reference number and a redundant description thereof may not be repeated for the sake of brevity.

Referring to FIG. 8, the second pads PD2 may be disposed on the side surface of the first substrate BS1, the side surface of the second substrate BS2, and the side surface of the sealant SLM, which is disposed between the first substrate BS1 and the second substrate BS2. In an embodiment, the second pads PD2 may be disposed on the side surface of a display circuit layer DCL.

The second contact pads DCB_PD may be disposed on a side surface of the display circuit board DCB. A top surface of the display circuit board DCB may be spaced from the top surface of the second contact pad DCB_PD in the third direction DR3. However, the present disclosure is not limited to this example, and the top surface of the second contact pads DCB_PD may be disposed near the top surface of the display circuit board DCB in the third direction DR3 to reduce a protruding length of the display circuit board DCB in the third direction DR3. The second contact pads DCB_PD may be adjacent to the second pads PD2. The second adhesive layer AL2 may be disposed between the second contact pads DCB_PD and the second pads PD2. The second adhesive layer AL2 may include an anisotropic conductive film. The anisotropic conductive film may include a resin having an adhesive property and conductive balls provided in the resin.

The display circuit board DCB may be pressed against the second pads PD2. As a result of such a pressing, the conductive balls of the anisotropic conductive film, which is disposed between the second pads PD2 and the second contact pads DCB_PD, may be in contact with each other, and thus, the second pads PD2 may be connected (e.g., electrically connected) to the second contact pads DCB_PD through the conductive balls. In other words, the second pads PD2 and the second contact pads DCB_PD may be connected (e.g., electrically connected) to each other through the second adhesive layer AL2.

The display circuit layer DCL may be connected (e.g., electrically connected) to the data driver DDV, the main circuit board PCB, and the like, through the second pads PD2 and the second contact pads DCB_PD.

FIGS. 9A, 9B, 9C, and 9D are diagrams illustrating a process of forming the first conductive layer. In the following description of FIGS. 9A, 9B, 9C, and 9D, an element previously described with reference to FIG. 3A may be identified by the same reference number and a redundant description thereof may not be repeated for the sake of brevity.

Figure 9A:
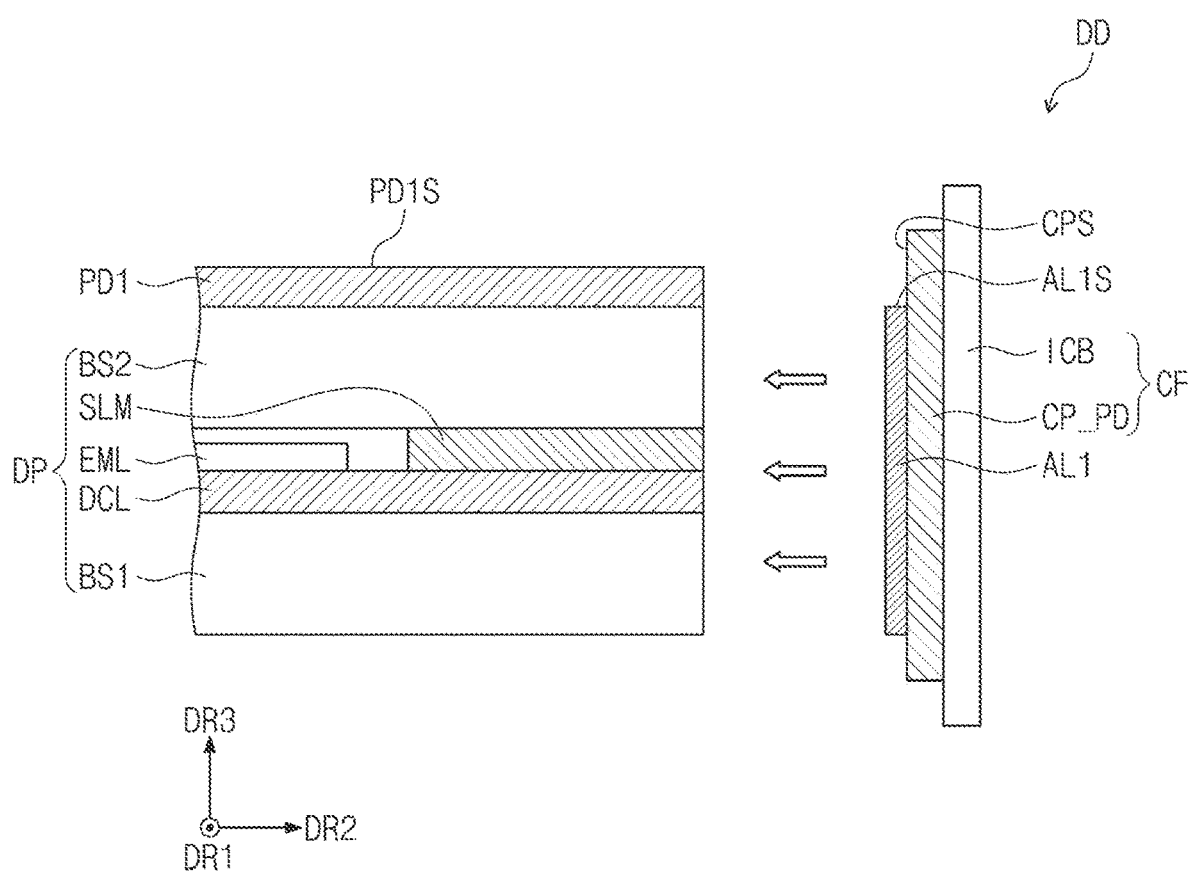
FIGS. 9A, 9B, 9C, and 9D are diagrams illustrating a process of forming the first conductive layer.

Referring to FIG. 9A, the first circuit film CF may be spaced from, but adjacent to, the display panel DP in the second direction DR2. The first adhesive layer AU may be attached to the side surface CPS of the first contact pad CP_PD. A width of the first adhesive layer AU in the third direction DR3 may be equal to a width (or a thickness) of the display panel DP in the third direction DR3. However, the width of the first adhesive layer AL1 is not limited thereto and may be variously changed in a suitable manner.

The first circuit film CF may be joined to (e.g., bonded to) the display panel DP through the first adhesive layer AL1. The first contact pad CP_PD may be joined to (e.g., bonded to) the side surface of the display panel DP through the first adhesive layer AL1.

The first contact pad CP_PD and the display panel DP may not be connected to each other by the first adhesive layer AL1. The display circuit layer DCL and the first contact pad CP_PD may not be electrically connected to each other by the first adhesive layer AL1. However, in the case where the first adhesive layer AL1 is an anisotropic conductive film, the first pad PD1 and the first contact pad CP_PD may be joined to (e.g., bonded to) each other by the first adhesive layer AU and may be connected (e.g., electrically connected) to each other through the first adhesive layer AL1.

Figure 9B:
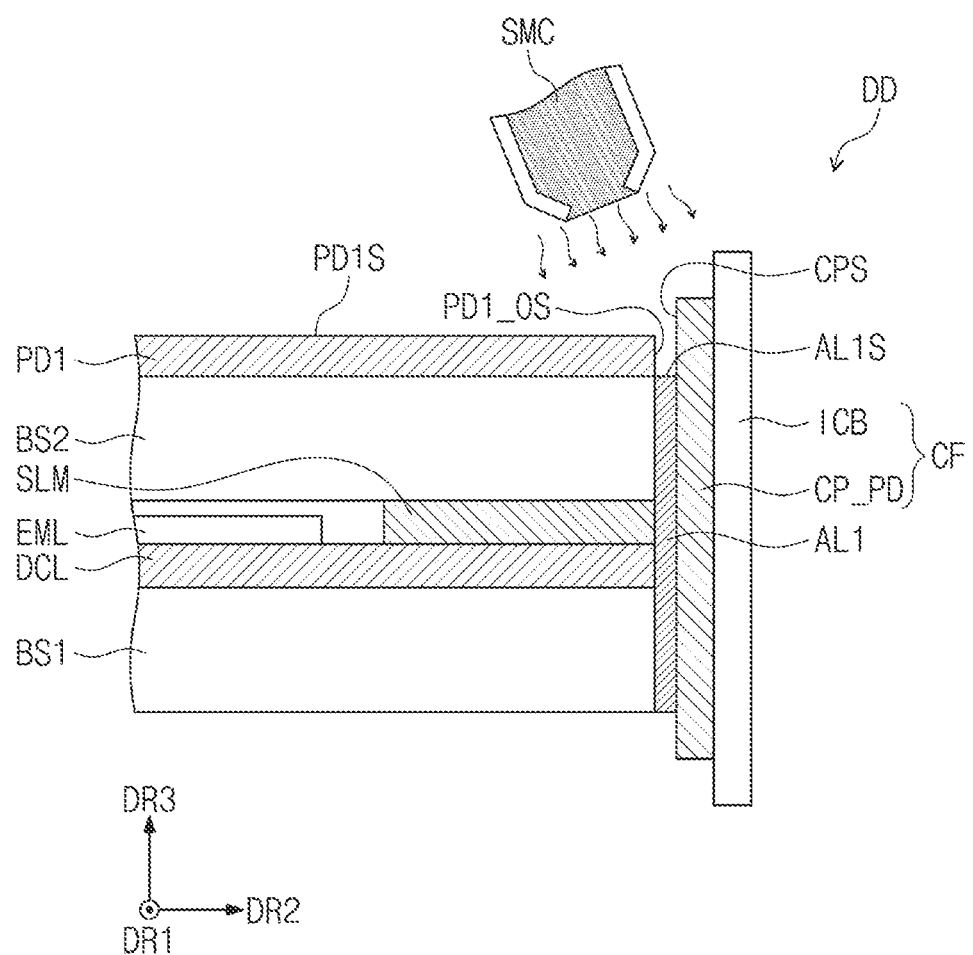

Referring to FIG. 9B, a spraying process may be performed on a region between the first pad PD1 and the first contact pad CP_PD. A powder sprayer SMC may be disposed near a region, in which the top surface of the display panel DP and the side surface CPS of the first contact pad CP_PD are disposed adjacent to each other. The powder sprayer SMC may spray a metal powder.

The metal powder may be sprayed from the powder sprayer SMC onto the side surface PD1_OS and the top surface PD1S of the first pad PD1, the top surface AL1S of the first adhesive layer AL1, and the side surface CPS of the first contact pad CP_PD.

The metal powder including a metallic material may have a good affinity to the pads PD1 and CP_PD. The metal powder may be injected or deposited on the pads PD1 and CP_PD and the top surface AU S of the first adhesive layer AU through a physical impact of the metal powder, which is sprayed from the powder sprayer SMC, and by impact heat, which is produced by the physical impact. However, an amount of the metal powder, which is formed on the partition portions PP (e.g., see FIG. 7) made of polyimide (PI) and on the input circuit board ICB, may be extremely small or may be substantially zero.

Figure 9C:
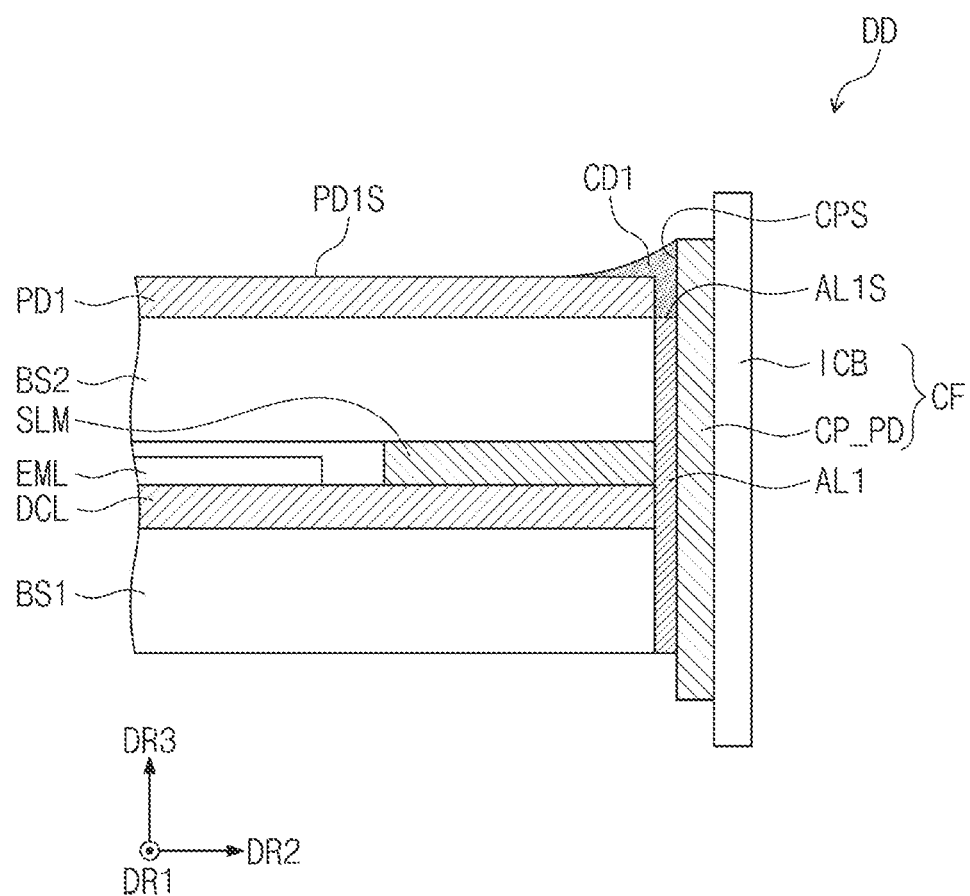

Referring to FIG. 9C, the metal powders, which are injected or deposited on the pads PD1 and CP_PD and the top surface AL1S of the first adhesive layer AL1, may form the first conductive layers CD1. Because each of the first pads PD1 is connected (e.g., electrically connected) to a corresponding one of the first contact pads CP_PD through the first conductive layer CD1, process time and process cost may be reduced relative to related art processes.

Unlike the related art process, in the process of fabricating the display device DD according to an embodiment of the present disclosure, a process of grinding a substrate and masking, metal-sputtering, and patterning processes, which are performed to form a pad on the side surface of the display module DM, may be omitted. Thus, the process of fabricating the display device DD may be simplified, and the process time may be reduced. Furthermore, wire-dislocation and wire-crack issues, which may be caused by the substrate grinding process, a wire-corrosion issue, which may be caused by a cleaning step after a polishing process, and damage of the display module DM, which may be caused by a laser patterning in the patterning process, may be prevented or substantially prevented.

Unlike the related art dotting process, in the process of fabricating the display device DD according to an embodiment of the present disclosure, because a metal in a liquid state is not dotted in the process of forming the first conductive layer CD1 between the first pads PD1 and the first contact pads CP_PD, the first conductive layer CD1 may be prevented or substantially prevented from being dislocated by a wetting effect. In other words, accuracy in the process of forming the first conductive layer CD1 may be improved. Furthermore, because the first conductive layers CD1 are formed (e.g., locally formed) by a spraying process, not in a one-by-one manner of connecting the first pads PD1 and the first contact pads CP_PD, the process time may be reduced.

In the process of fabricating the display device DD according to an embodiment of the present disclosure, the process of forming the first conductive layers CD1 may not include a masking and patterning process, unlike the related art sputtering process. In the spraying process according to an embodiment of the present disclosure, because the first conductive layers CD1 are locally formed, the process cost and the process time may be reduced.

According to an embodiment of the present disclosure, the first contact pad CP_PD of the first circuit film CF may be joined to (e.g., bonded to) the side surface of the display module DM by the first adhesive layer AL1. The first pads PD1 and the first contact pads CP_PD may be connected (e.g., electrically connected) to each other by the first conductive layer CD1. Thus, an area of the bezel region in the display device DD may be reduced.

Furthermore, because the first pad PD1 is not extended to the side surface of the second substrate BS2, a crack issue of the first pad PD1, which may occur at a corner connecting the top and side surfaces of the second substrate BS2, may be prevented or substantially prevented. Thus, reliability of the joining of the first pad PD1 and the first contact pad CP_PD may be improved.

Figure 9D:
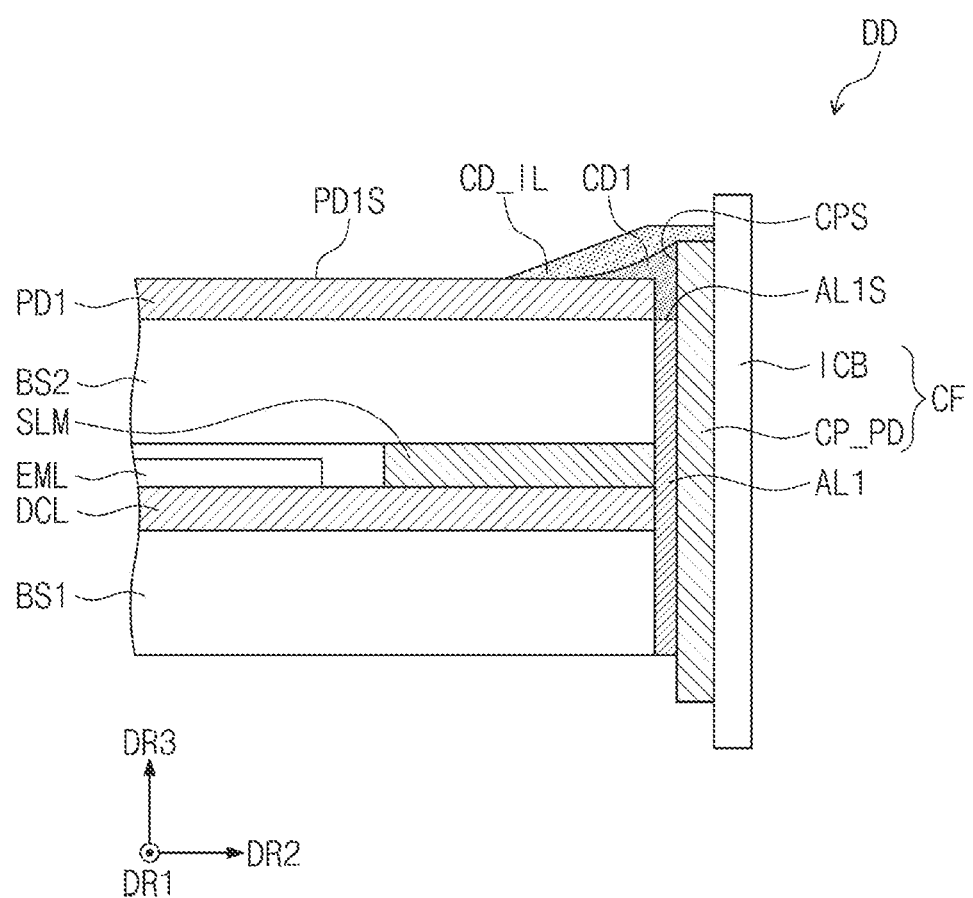

Referring to FIG. 9D, the protection layer CD_IL may be disposed on the top surface of the first conductive layer CD1. The protection layer CD_IL may be formed of or include at least one of resin, tuffy, and organic materials. However, the material of the protection layer CD_IL is not limited to these examples and may be variously changed in a suitable manner.

The protection layer CD_IL may be coated on the first conductive layers CD1, the first contact pad CP_PD, and the first pad PD1. In an embodiment, the protection layer CD_IL may then be cured by an ultraviolet light. The protection layer CD_IL may be formed to cover (e.g., fully cover) the first conductive layers CD1. The protection layer CD_IL may increase an adhesion strength of the first conductive layers CD1 and may prevent each of the first conductive layers CD1 from being undesirably connected to the unintended ones of the first conductive layers CD1, the first pads PD1, and the first contact pads CP_PD.

Figure 10:
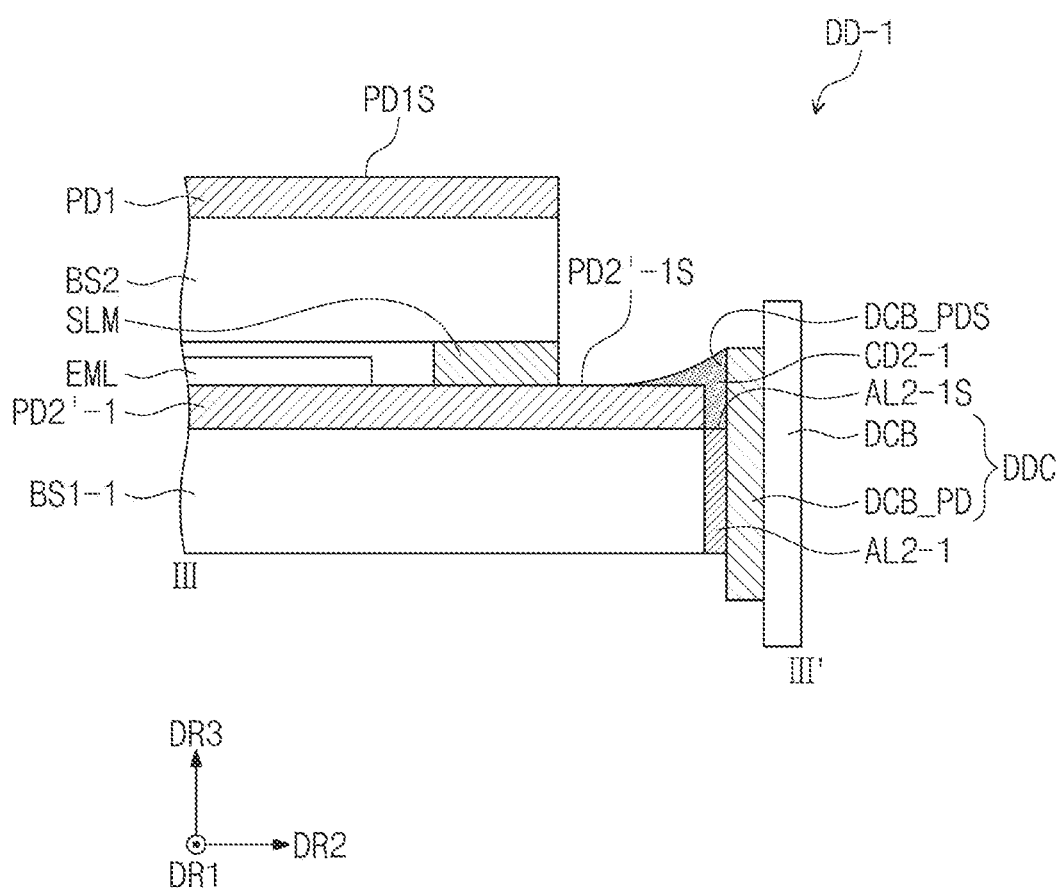
FIG. 10 is a cross-sectional view taken along the line III-III' of FIG. 2, according to other embodiment of the present disclosure.

FIG. 10 is a cross-sectional view taken along the line III-III' of FIG. 2, according to other embodiment of the present disclosure. In the following description of FIG. 10, an element previously described with reference to FIGS. 6 and 8 may be identified by the same reference number and a redundant description thereof may not be repeated for the sake of brevity.

Referring to FIG. 10, a first substrate BS1-1 of a display device DD-1 according to the present embodiment may protrude in the second direction DR2, compared with (relative to) the side surface of the second substrate BS2. A second pad PD2'-1 may be disposed on the first substrate BS1-1. The second pad PD2'-1 may be a portion of the display circuit layer DCL (e.g., see FIG. 3A). The second pad PD2'-1 may protrude in the second direction DR2, compared with (relative to) the side surface of the second substrate BS2.

A side surface DCB_PDS of the second contact pad DCB_PD may face a side surface of the first substrate BS1-1. The second contact pad DCB_PD may protrude in the third direction DR3, compared with (relative to) a top surface of the first substrate BS1-1, and may be joined to (e.g., coupled to) the side surface of the first substrate BS1-1. A protruding length of the second contact pad DCB_PD may range from several micrometers to several hundreds of micrometers.

A second adhesive layer AL2-1 may be disposed between the first substrate BS1-1 and the second contact pad DCB_PD. The side surface of the first substrate BS1-1 may be joined to (e.g., bonded to) the side surface DCB_PDS of the second contact pad DCB_PD by the second adhesive layer AL2-1. The second adhesive layer AL2-1 may be a resin film, an anisotropic conductive film, or a non-conductive film. However, the present disclosure is not limited to this example, and in an embodiment, the second adhesive layer AL2-1 may include at least one of any suitable adhesive or gluing agent.

A second conductive layer CD2-1 may be disposed on a top surface PD2'-1S and a side surface of the second pad PD2'-1, a top surface AL2-1S of the second adhesive layer AL2-1, and the side surface DCB_PDS of the second contact pad DCB_PD.

The second conductive layer CD2-1 may be in contact with the second pad PD2'-1 and the second contact pad DCB_PD. The second conductive layer CD2-1 may connect (e.g., electrically connect) the second pad PD2'-1 to the second contact pad DCB_PD.

In an embodiment, the first pad PD1 may be connected (e.g., electrically connected) to the first contact pad CP_PD through the first conductive layer CD1.

According to an embodiment of the present disclosure, the second conductive layers CD2-1 may be formed through the spraying process of the metal powder. The first conductive layers CD1 may facilitate an electrical connection between the first pads PD1 and the first contact pads CP_PD. The second conductive layers CD2-1 may facilitate an electrical connection between the second pads PD2'-1 and the second contact pads DCB_PD.

Figure 11:
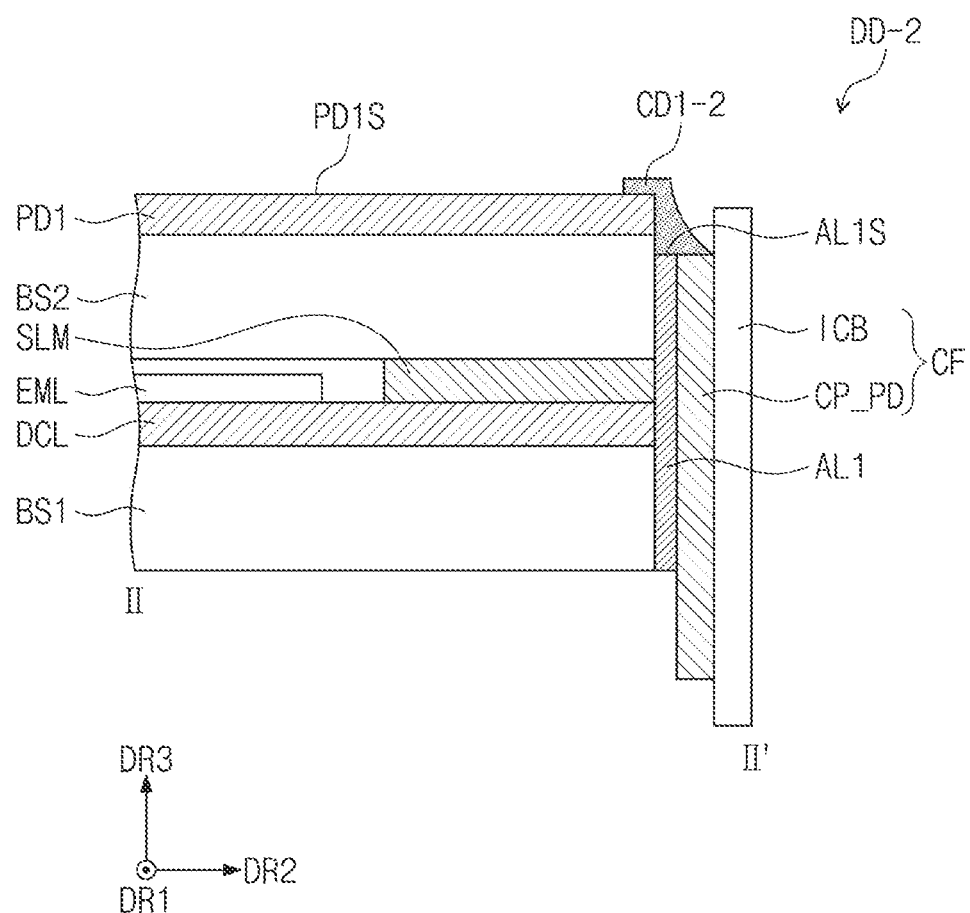
FIG. 11 is a cross-sectional view taken along the line II-II' of FIG. 2, according to other embodiment of the present disclosure.

FIG. 11 is a cross-sectional view taken along the line II-II' of FIG. 2, according to other embodiment of the present disclosure. In the following description of FIG. 11, an element previously described with reference to FIG. 6 may be identified by the same reference number and a redundant description thereof may not be repeated for the sake of brevity.

Referring to FIG. 11, the first contact pad CP_PD of a display device DD-2 according to the present embodiment may be disposed below the top surface of the second substrate BS2. The first contact pad CP_PD may not protrude in the third direction DR3, compared with (relative to) the top surface of the second substrate BS2. For example, the top surface of the first contact pad CP_PD may be below the top surface of the second substrate BS2.

A first conductive layer CD1-2 may be in contact with the first pad PD1, the side surface of the second substrate BS2, the top surface AL1S of the first adhesive layer AL1, and the first contact pad CP_PD. The first conductive layer CD1-2 may connect (e.g., electrically connect) the first pad PD1 to the first contact pad CP_PD.

According to an embodiment of the present disclosure, because the first circuit film CF does not protrude in the third direction DR3 (e.g., relative to the first pad PD1), the first circuit film CF may be prevented or substantially prevented from being damaged.

Figure 12A:
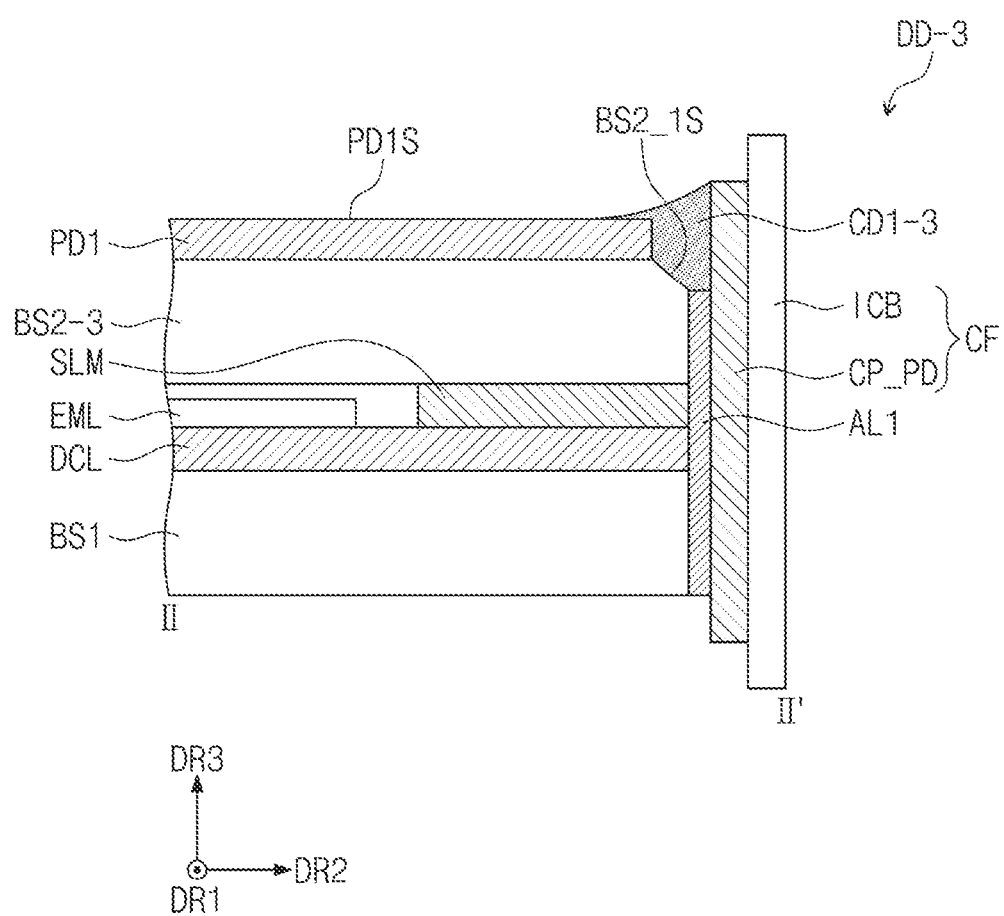
FIGS. 12A and 12B are cross-sectional views taken along the line II-II' of FIG. 2, according to other embodiment of the present disclosure.
Figure 12B:
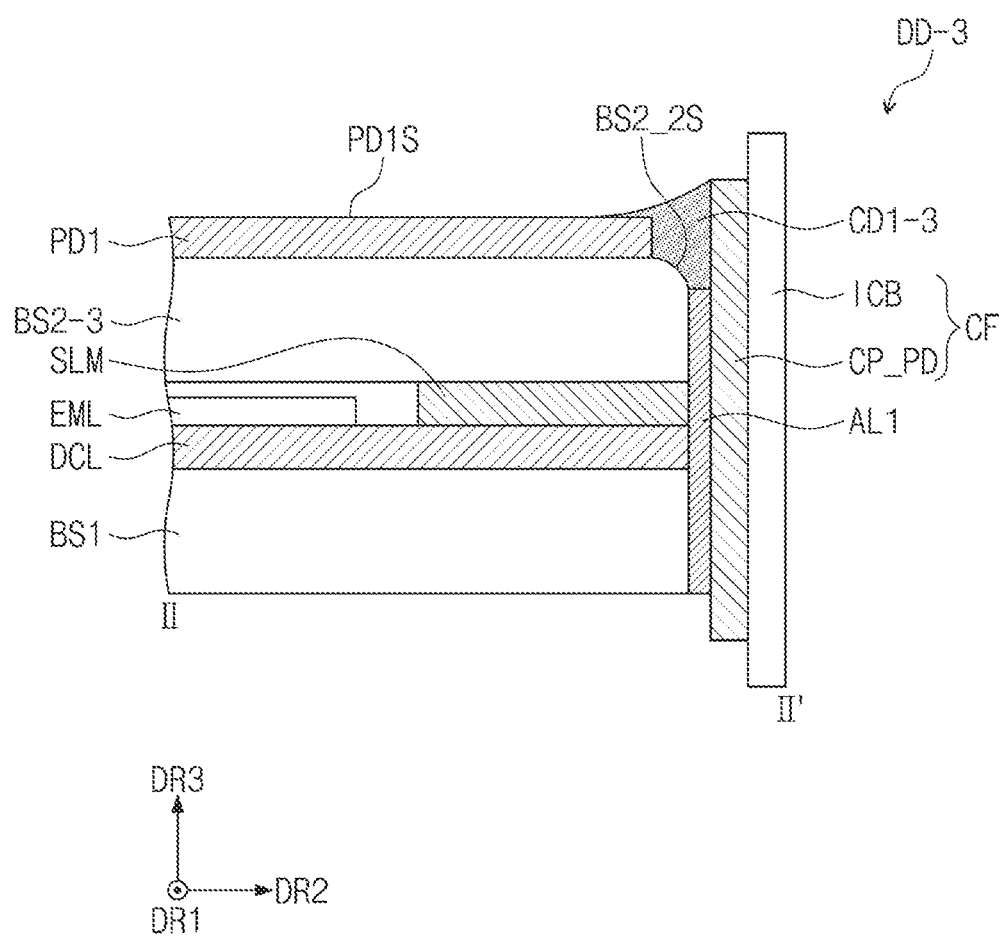

FIGS. 12A and 12B are cross-sectional views taken along the line II-II' of FIG. 2, according to other embodiment of the present disclosure. In the following description of FIGS. 12A and 12B, an element previously described with reference to FIG. 6 may be identified by the same reference number and a redundant description thereof may not be repeated for the sake of brevity.

Referring to FIG. 12A, a second substrate BS2-3 of a display device DD-3 according to the present embodiment may have a beveled surface, which is formed near a corner between side and top surfaces of the second substrate BS2-3. The beveled surface as shown in FIG. 12A will be referred to as an inclined surface BS2_1S. The inclined surface BS2_1S may be formed by chamfering the corner between the side and top surfaces of the second substrate BS2-3.

The first pad PD1 may be disposed on the second substrate BS2-3. A side surface of the first pad PD1 may be spaced from the side surface of the second substrate BS2-3.

A first conductive layer CD1-3 may be in contact with the first pad PD1, inclined surface BS2_1S, the first adhesive layer AL1, and the first contact pad CP_PD. The first conductive layer CD1-3 may connect (e.g., electrically connect) the first pad PD1 to the first contact pad CP_PD.

Due to the inclined surface BS2_1S, the corner between the top and side surfaces of the second substrate BS2-3 may not have a sharp section. Thus, the possibility of crack may be reduced. Referring to FIG. 12B, the second substrate BS2-3 of the display device DD-3 according to the present embodiment may have a beveled surface, which is formed near a corner between side and top surfaces of the second substrate BS2-3. The beveled surface as shown in FIG. 12B will be referred to as a curved surface BS2_2S. The curved surface BS2_2S may be formed by chamfering the corner between the side and top surfaces of the second substrate BS2-3.

The first pad PD1 may be disposed on the second substrate BS2-3. The side surface of the first pad PD1 may be spaced from the side surface of the second substrate BS2-3.

The first conductive layer CD1-3 may be in contact with the first pad PD1, the curved surface BS2_2S, the first adhesive layer AL1, and the first contact pad CP_PD. The first conductive layer CD1-3 may connect (e.g., electrically connect) the first pad PD1 to the first contact pad CP_PD.

Due to the curved surface BS2_2S, the corner between the top and side surfaces of the second substrate BS2-3 may not have a sharp section. Thus, the possibility of crack may be reduced.

Figure 13A:
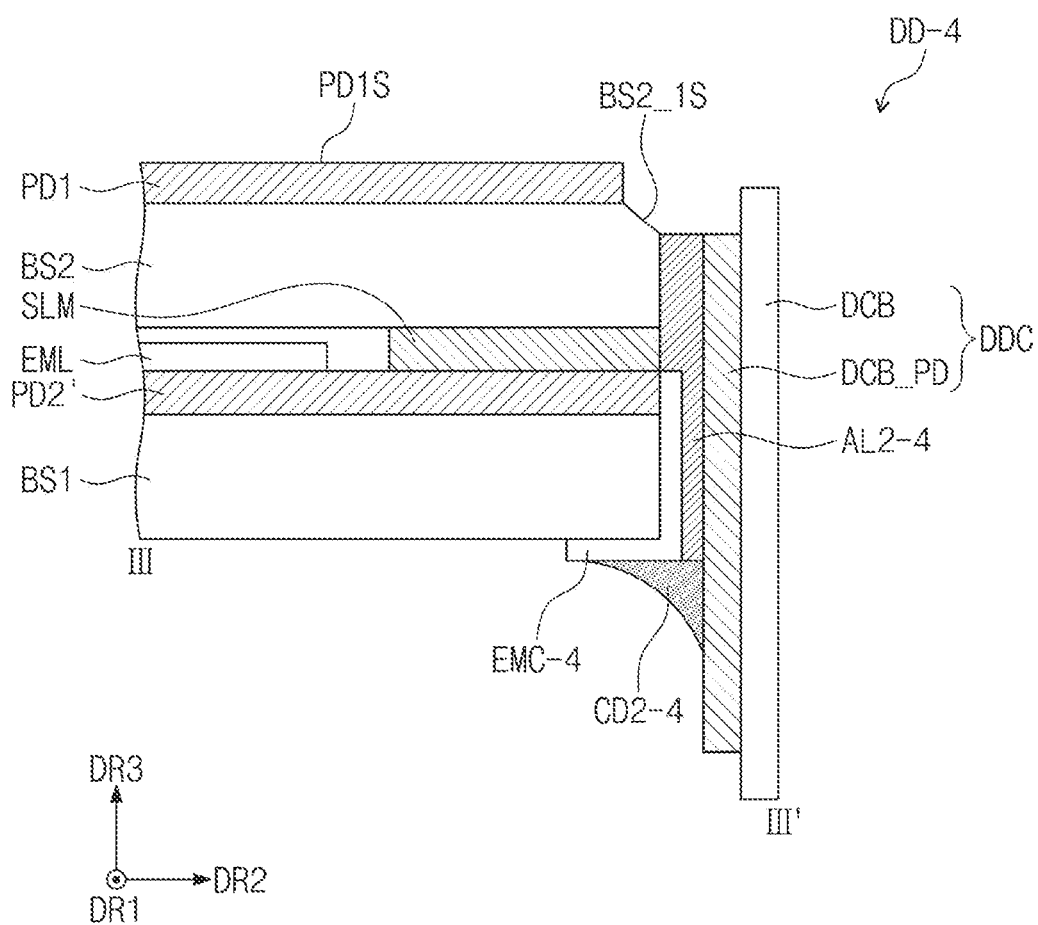
FIG. 13A is a cross-sectional view taken along the line III-III' of FIG. 2, according to other embodiment of the present disclosure.

FIG. 13A is a cross-sectional view taken along the line III-III' of FIG. 2, according to other embodiment of the present disclosure. In the following description of FIG. 13A, an element previously described with reference to FIGS. 6 and 8 may be identified by the same reference number and a redundant description thereof may not be repeated for the sake of brevity.

Referring to FIG. 13A, a display device DD-4 according to the present embodiment may include a deposition metal layer EMC-4, which is formed to cover (e.g., continuously cover) the side surface of the first substrate BS1, a side surface of a second pad PD2', and a bottom surface of the first substrate BS1. The deposition metal layer EMC-4 may be connected (e.g., electrically connected) to the second pad PD2'.

A second adhesive layer AL2-4 may be attached to the side surface of the second substrate BS2, the side surface of the sealant SLM, and a side surface of the deposition metal layer EMC-4.

The side surface of the second substrate BS2, the side surface of the sealant SLM, and the side surface of the deposition metal layer EMC-4 may be attached to the second contact pad DCB_PD by the second adhesive layer AL2-4.

A second conductive layer CD2-4 may be formed to cover (e.g., continuously cover) a bottom portion of the deposition metal layer EMC-4, a bottom portion of the second adhesive layer AL2-4, and a side surface of the second contact pad DCB_PD. The second conductive layer CD2-4 may connect (e.g., electrically connect) the deposition metal layer EMC-4 to the second contact pad DCB_PD.

The second pad PD2' may be connected (e.g., electrically connected) to the second contact pad DCB_PD through the deposition metal layer EMC-4 and the second conductive layer CD2-4.

According to an embodiment of the present disclosure, a connection area between the second pad PD2' and the second contact pad DCB_PD may be increased, and in this case, resistance between the second pad PD2' and the second contact pad DCB_PD may be reduced and thereby reliability in a signal transmission therebetween may be improved.

Figure 13B:
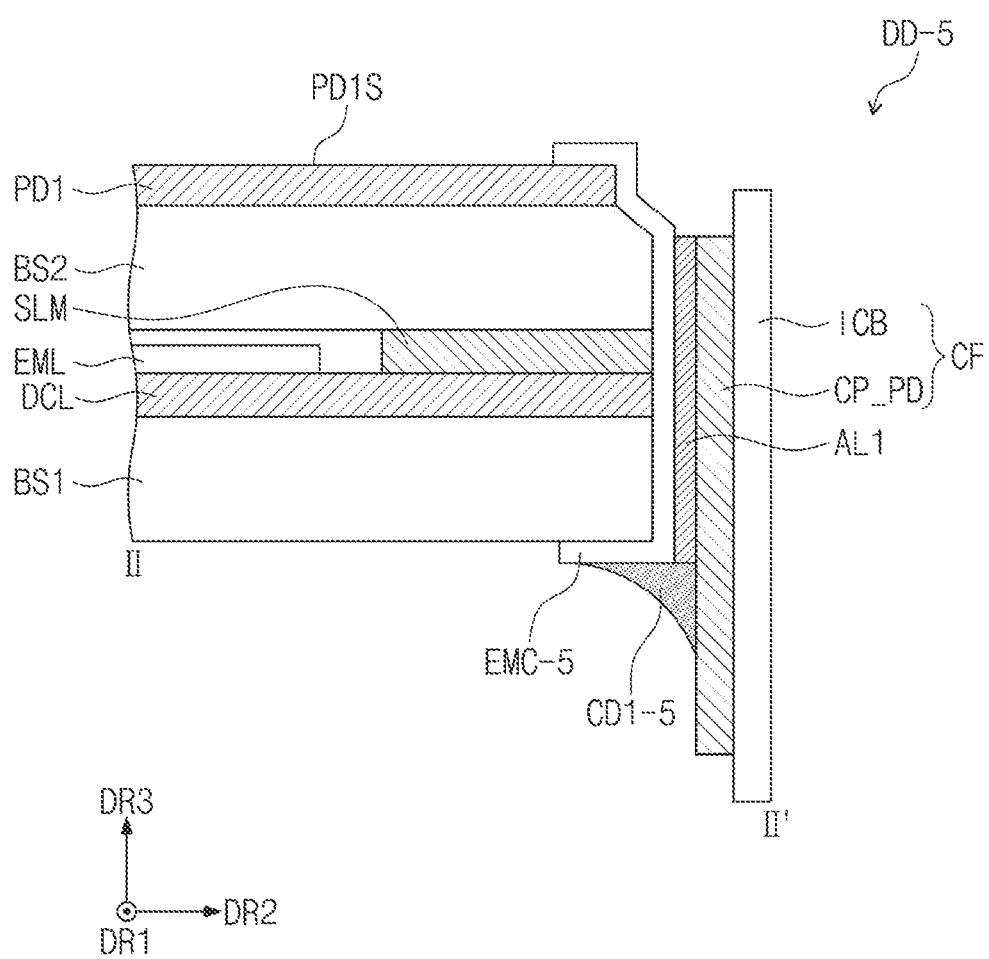
FIG. 13B is a cross-sectional view taken along the line II-II' of FIG. 2, according to other embodiment of the present disclosure.

FIG. 13B is a cross-sectional view taken along the line II-II' of FIG. 2, according to other embodiment of the present disclosure. In the following description of FIG. 13B, an element previously described with reference to FIG. 6 may be identified by the same reference number and a redundant description thereof may not be repeated for the sake of brevity.

Referring to FIG. 13B, a display device DD-5 according to the present embodiment may include a deposition metal layer EMC-5, which is formed to cover (e.g., continuously cover) the first pad PD1, the second substrate BS2, the side surface of the sealant SLM, the side surface of the display circuit layer DCL, and the side and bottom surfaces of the first substrate BS1. The deposition metal layer EMC-5 may be connected (e.g., electrically connected) to the first pad PD1.

The first adhesive layer AL1 may be attached to a side surface of the deposition metal layer EMC-5. The side surface of the deposition metal layer EMC-5 may be attached to the first contact pad CP_PD by the first adhesive layer AL1.

The display circuit layer DCL may include polyimide (PI). However, the present disclosure is not limited to this example, and in an embodiment, the display circuit layer DCL may include various suitable materials (e.g., organic or inorganic materials). Thus, the display circuit layer DCL may not be electrically connected to the deposition metal layer EMC-5.

A first conductive layer CD1-5 may be formed to cover (e.g., continuously cover) a bottom portion of the deposition metal layer EMC-5, a bottom portion of the first adhesive layer AL1, and the side surface of the first contact pad CP_PD. The first conductive layer CD1-5 may connect (e.g., electrically connect) the deposition metal layer EMC-5 to the first contact pad CP_PD.

The first pad PD1 may be connected (e.g., electrically connected) to the first contact pad CP_PD through the deposition metal layer EMC-5 and the first conductive layer CD1-5.

According to an embodiment of the present disclosure, the corner portion of the second substrate BS2 and the top portion of the first circuit film CF may be prevented or substantially prevented from being damaged. In addition, a connection area between the first pad PD1 and the first contact pad CP_PD may be increased, and in this case, resistance between the first pad PD1 and the first contact pad CP_PD may be reduced and thereby reliability in a signal transmission therebetween may be improved.

Figure 14A:
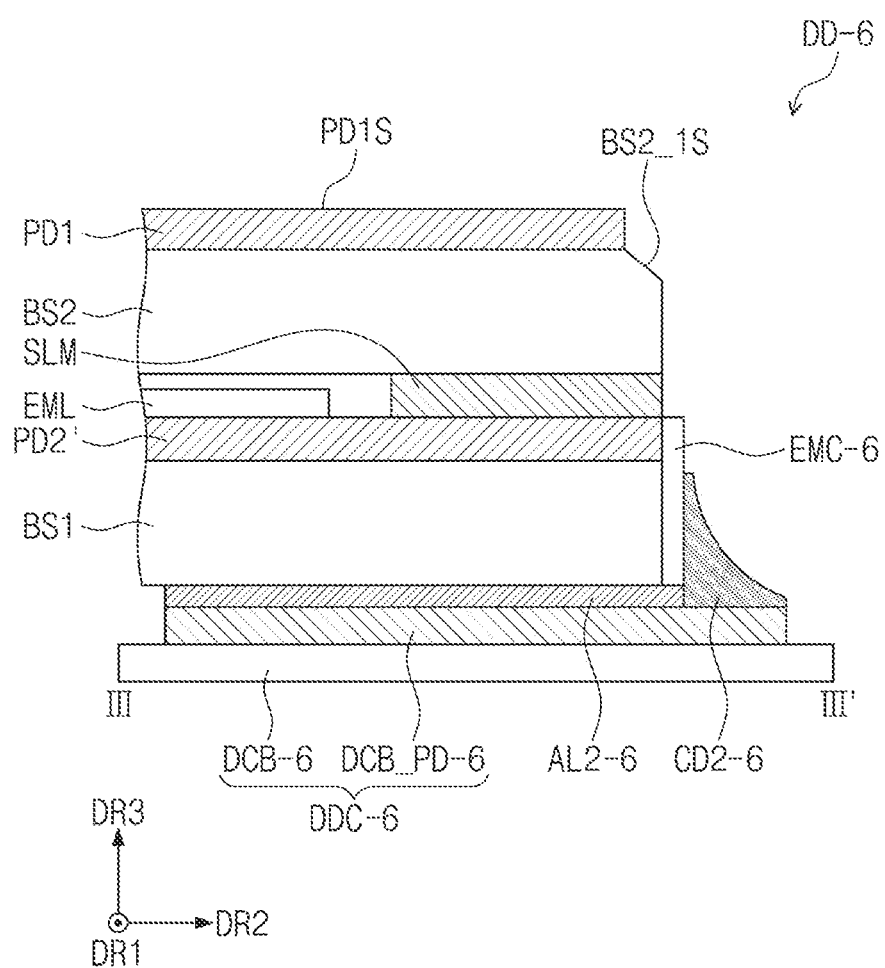
FIG. 14A is a cross-sectional view taken along the line III-III' of FIG. 2, according to other embodiment of the present disclosure.

FIG. 14A is a cross-sectional view taken along the line III-III' of FIG. 2, according to other embodiment of the present disclosure. In the following description of FIG. 14A, an element previously described with reference to FIGS. 6 and 8 may be identified by the same reference number and a redundant description thereof may not be repeated for the sake of brevity.

Referring to FIG. 14A, a display device DD-6 according to the present embodiment may include a deposition metal layer EMC-6, which is formed to cover (e.g., continuously cover) the side surface of the first substrate BS1 and the side surface of the second pad PD2'. The deposition metal layer EMC-6 may be connected (e.g., electrically connected) to the second pad PD2'.

A second adhesive layer AL2-6 may be attached to a bottom portion of the first substrate BS1 and a bottom portion of the deposition metal layer EMC-6.

A second circuit film DDC-6 may be disposed on the bottom portion of the first substrate BS1. The second circuit film DDC-6 may include a second contact pad DCB_PD-6 and a display circuit board DCB-6. The second contact pad DCB_PD-6 may be disposed on the display circuit board DCB-6. A side surface of the second contact pad DCB_PD-6 may protrude in the second direction DR2, compared with (relative to) the side surface of the first substrate BS1.

The bottom portion of the first substrate BS1 and the bottom portion of the deposition metal layer EMC-6 may be attached to the second contact pad DCB_PD-6 by the second adhesive layer AL2-6.

A second conductive layer CD2-6 may be formed to cover (e.g., continuously cover) a side surface of the deposition metal layer EMC-6, a side surface of the second adhesive layer AL2-6, and a top surface of the second contact pad DCB_PD-6. The second conductive layer CD2-6 may connect (e.g., electrically connect) the deposition metal layer EMC-6 to the second contact pad DCB_PD-6.

The second pad PD2' may be connected (e.g., electrically connected) to the second contact pad DCB_PD-6 through the deposition metal layer EMC-6 and second conductive layer CD2-6.

According to an embodiment of the present disclosure, a connection area between the second pad PD2' and the second contact pad DCB_PD-6 may be increased, and in this case, resistance between the second pad PD2' and the second contact pad DCB_PD-6 may be reduced and thereby reliability in a signal transmission therebetween may be improved.

Figure 14B:
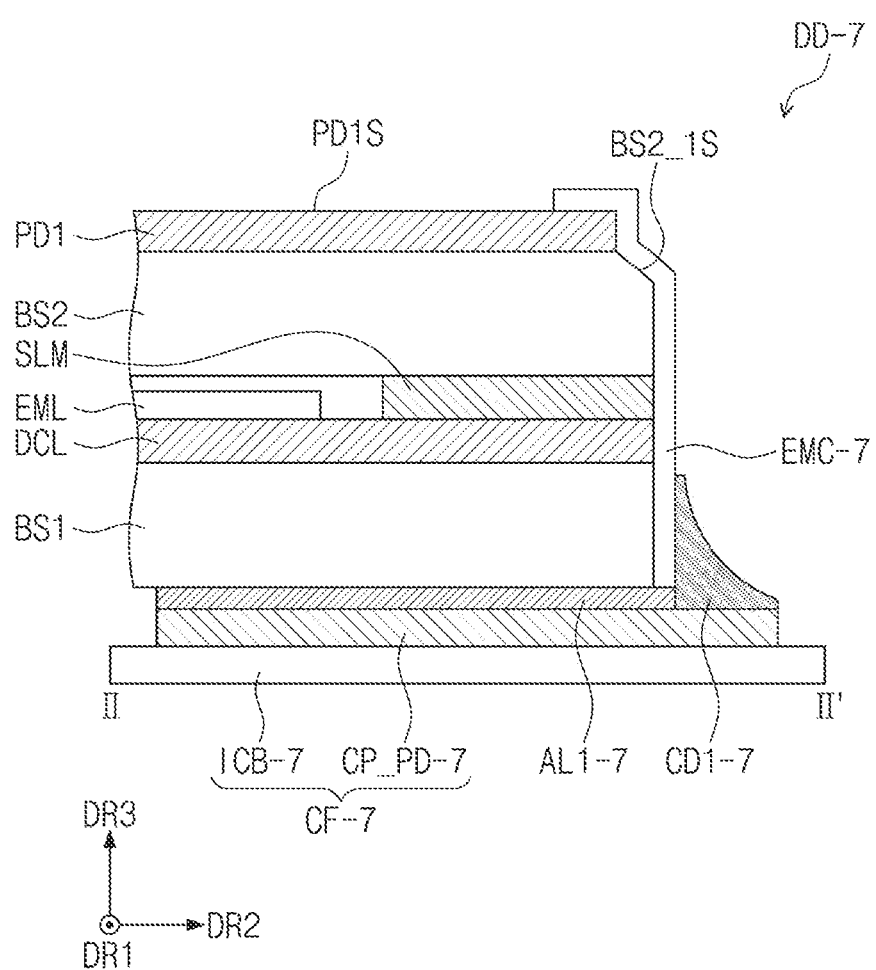
FIG. 14B is a cross-sectional view taken along the line II-II' of FIG. 2, according to other embodiment of the present disclosure.

FIG. 14B is a cross-sectional view taken along the line II-II' of FIG. 2, according to other embodiment of the present disclosure. In the following description of FIG. 14B, an element previously described with reference to FIG. 6 may be identified by the same reference number and a redundant description thereof may not be repeated for the sake of brevity.

Referring to FIG. 14B, a display device DD-7 according to the present embodiment may include a deposition metal layer EMC-7, which is formed to cover (e.g., continuously cover) the first pad PD1, the second substrate BS2, the side surface of the sealant SLM, the side surface of the display circuit layer DCL, and the side surface of the first substrate BS1. The deposition metal layer EMC-7 may be connected (e.g., electrically connected) to the first pad PD1.

A first adhesive layer AL1-7 may be attached to the bottom portion of the first substrate BS1 and a bottom portion of the deposition metal layer EMC-7. The bottom portion of the first substrate BS1 and the bottom portion of the deposition metal layer EMC-7 may be attached to a first contact pad CP_PD-7 by the first adhesive layer AL1-7.

A first circuit film CF-7 may be disposed on the bottom portion of the first substrate BS1. The first circuit film CF-7 may include the first contact pad CP_PD-7 and an input circuit board ICB-7. The first contact pad CP_PD-7 may be disposed on the input circuit board ICB-7. A side surface of the first contact pad CP_PD-7 may protrude in the second direction DR2, compared with (relative to) the side surface of the first substrate BS1.

The display circuit layer DCL may include polyimide (PI). Thus, the display circuit layer DCL may not be electrically connected to the deposition metal layer EMC-7.

A first conductive layer CD1-7 may be formed to cover (e.g., continuously cover) a side surface of the deposition metal layer EMC-7, a side surface of the first adhesive layer AL1-7, and a top portion of the first contact pad CP_PD-7. The first conductive layer CD1-7 may connect (e.g., electrically connect) the deposition metal layer EMC-7 to the first contact pad CP_PD-7.

The first pad PD1 may be connected (e.g., electrically connected) to the first contact pad CP_PD-7 through the deposition metal layer EMC-7 and the first conductive layer CD1-7.

According to an embodiment of the present disclosure, the corner portion of the second substrate BS2 may be prevented or protected from being damaged. In addition, a connection area between the first pad PD1 and the first contact pad CP_PD-7 may be increased, and in this case, resistance between the first pad PD1 and the first contact pad CP_PD-7 may be reduced and thereby reliability in a signal transmission therebetween may be improved.

Figure 15:
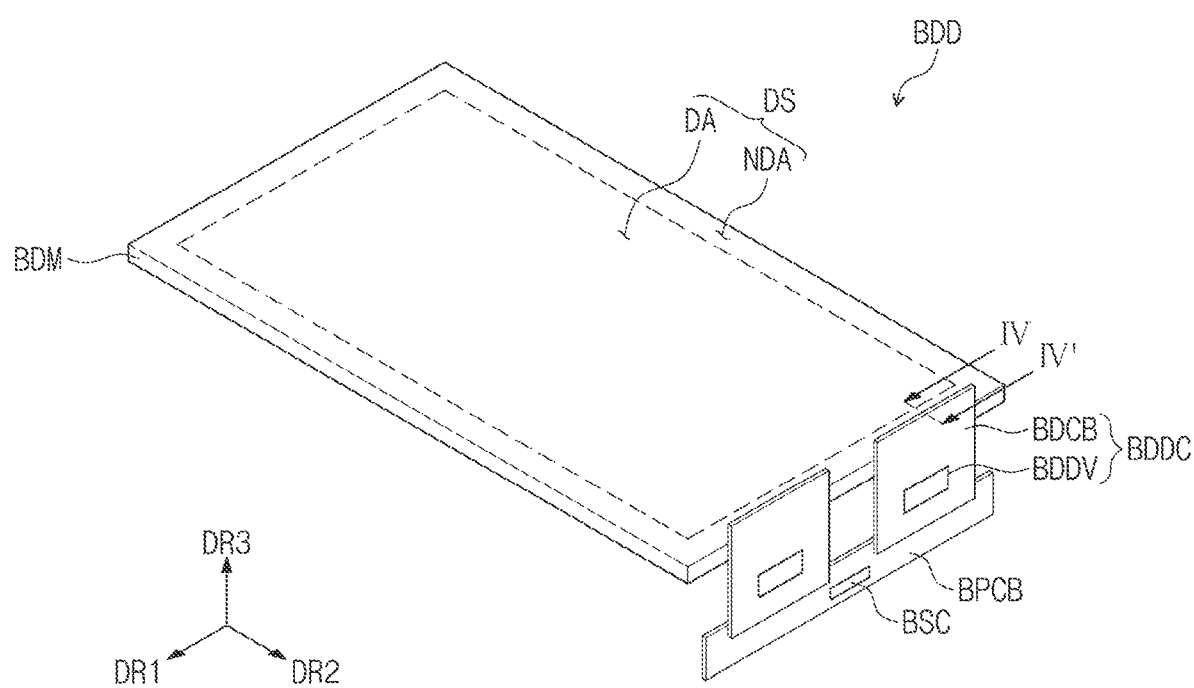
FIG. 15 is a perspective view illustrating a display device according to other embodiment of the present disclosure.

FIG. 15 is a perspective view illustrating a display device according to other embodiment of the present disclosure. An element previously described with reference to FIGS. 1 and 2 may be identified by the same reference number and a redundant description thereof may not be repeated for the sake of brevity.

FIG. 15 illustrates an example, in which a display device BDD is a large-sized display device. Referring to FIG. 15, the display device BDD may include a display module BDM, a second circuit film BDDC, a main circuit board BPCB, and a signal control unit BSC.

The second circuit film BDDC may include a display circuit board BDCB and a data driver BDDV. The data driver BDDV may be disposed on the display circuit board BDCB. The data driver BDDV may provide control signals, which are transmitted from the signal control unit BSC of the main circuit board BPCB, to the display module BDM. The data driver BDDV may produce driving signals, which will be used to drive the display module BDM, based on control signals provided from the signal control unit BSC. The driving signals output from the data driver BDDV may be transmitted to the display module BDM through the display circuit board BDCB.

According to an embodiment of the present disclosure, the second circuit film BDDC may be joined to (e.g., coupled to) a side surface of the display module BDM to be connected to (e.g., electrically connected to) signal lines. Because the second circuit film BDDC is joined to (e.g., coupled to) the side surface of the display module BDM, the non-display region NDA may be shrunken or reduced. Thus, an area of the bezel region in the display device BDD may be reduced.

Figure 16:
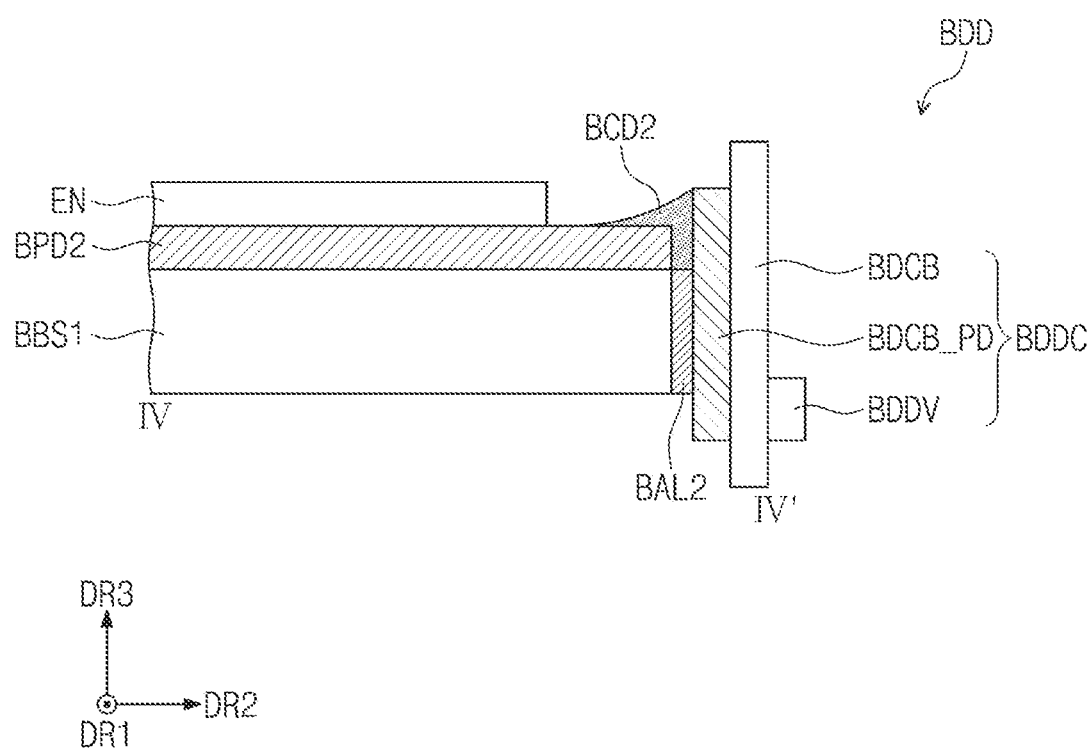
FIG. 16 is a cross-sectional view taken along the line IV-IV' of FIG. 15, according to other embodiment of the present disclosure.

FIG. 16 is a cross-sectional view taken along the line IV-IV' of FIG. 15, according to other embodiment of the present disclosure. In the following description of FIG. 16, an element previously described with reference to FIG. 15 may be identified by the same reference number and a redundant description thereof may not be repeated for the sake of brevity.

Referring to FIG. 16, the display device BDD according to the present embodiment may include the second circuit film BDDC, a second conductive layer BCD2, and a second adhesive layer BAL2.

The second circuit film BDDC may include a second contact pad BDCB_PD. The second contact pad BDCB_PD may be disposed on a side surface of the display circuit board BDCB and may be connected (e.g., electrically connected) to the display circuit board BDCB.

A second pad BPD2 may be disposed on a top surface of a first substrate BBS1. An encapsulation layer EN may be disposed on a top surface of the second pad BPD2.

The second adhesive layer BAL2 may be attached to a side surface of the first substrate BBS1. The side surface of the first substrate BBS1 may be joined to (e.g., bonded to) a side surface of the second contact pad BDCB_PD through the second adhesive layer BAL2.

The second conductive layer BCD2 may be disposed on top and side surfaces of the second pad BPD2, a top surface of the second adhesive layer BAL2, and the side surface of the second contact pad BDCB_PD. The second conductive layer BCD2 may be formed by a spraying process.

The second conductive layer BCD2 may be in contact with the top and side surfaces of the second pad BPD2, the top surface of the second adhesive layer BAL2, and the side surface of the second contact pad BDCB_PD. The second conductive layer BCD2 may connect (e.g., electrically connect) the second pad BPD2 to the second contact pad BDCB_PD.

Unlike the related art process, the process of fabricating the display device BDD according to an embodiment of the present disclosure may be simplified, and the process time may be reduced. Furthermore, wire-dislocation and wire-crack issues, which may be caused by the substrate grinding process, a wire-corrosion issue, which may be caused by a cleaning step after a polishing process, and damage of the display module BDM, which may be caused by a laser patterning in the patterning process, may be prevented or substantially prevented.

Figure 17:
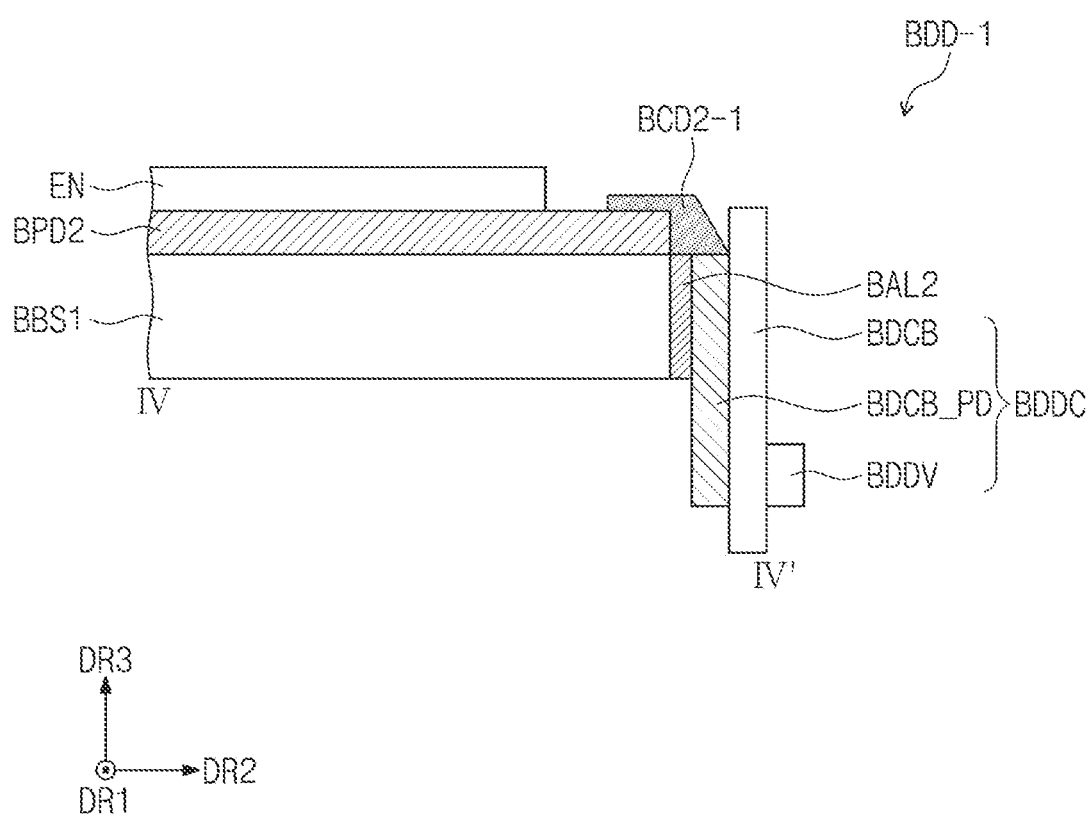
FIG. 17 is a cross-sectional view taken along the line IV-IV' of FIG. 15, according to other embodiment of the present disclosure.

FIG. 17 is a cross-sectional view taken along the line IV-IV' of FIG. 15, according to other embodiment of the present disclosure. In the following description of FIG. 17, an element previously described with reference to FIGS. 15 and 16 may be identified by the same reference number and a redundant description thereof may not be repeated for the sake of brevity.

Referring to FIG. 17, the second contact pad BDCB_PD of a display device BDD-1 according to the present embodiment may be disposed on the side surface of the first substrate BBS1. The second contact pad BDCB_PD may be joined to (e.g., bonded to) the first substrate BBS1 through the second adhesive layer BAL2. The second contact pad BDCB_PD may not protrude in the third direction DR3, compared with (relative to) a top surface of the first substrate BBS1.

A second conductive layer BCD2-1 may be disposed on the second pad BPD2, the top surface of the second adhesive layer BAL2, and the top surface of the second contact pad BDCB_PD. The second conductive layer BCD2-1 may be in contact with the second pad BPD2, the top surface of the second adhesive layer BAL2, and the top surface of the second contact pad BDCB_PD. The second conductive layer BCD2-1 may connect (e.g., electrically connect) the second pad BPD2 to the second contact pad BDCB_PD.

Because the second circuit film BDDC does not protrude in the third direction DR3 (e.g., relative to the encapsulation layer EN), the second circuit film BDDC may be prevented or substantially prevented from being damaged.

Figure 18:
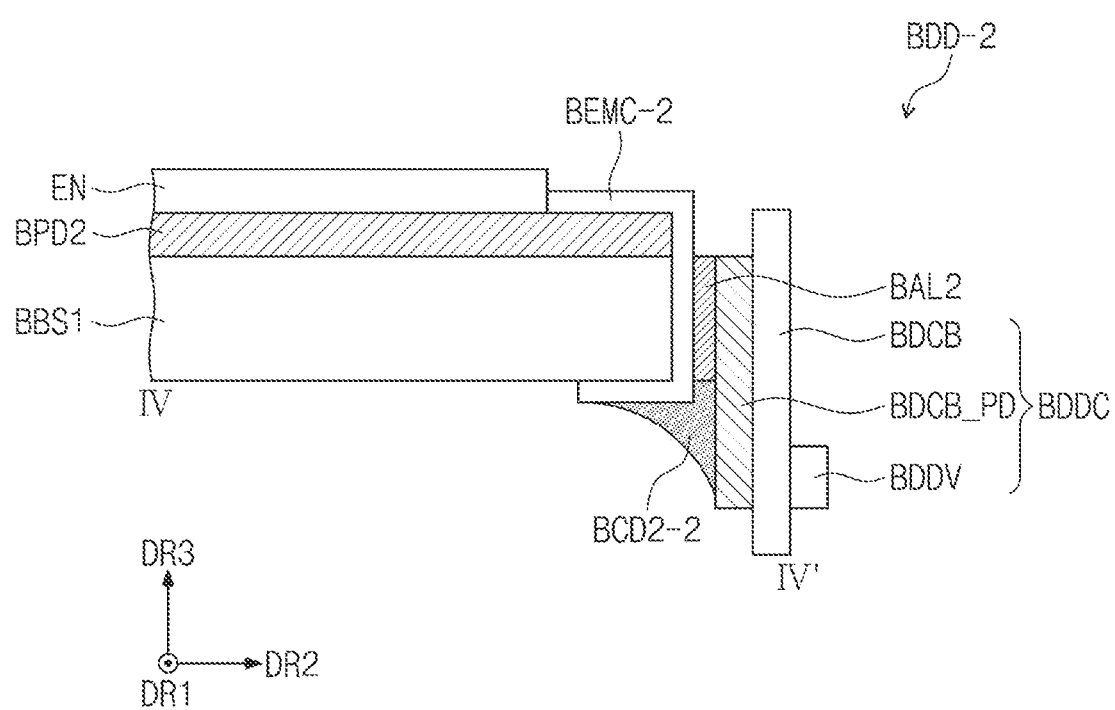
FIG. 18 is a cross-sectional view taken along the line IV-IV' of FIG. 15, according to other embodiment of the present disclosure.

FIG. 18 is a cross-sectional view taken along the line IV-IV' of FIG. 15, according to other embodiment of the present disclosure. In the following description of FIG. 18, an element previously described with reference to FIGS. 15 and 16 may be identified by the same reference number and a redundant description thereof may not be repeated for the sake of brevity.

Referring to FIG. 18, a display device BDD-2 according to the present embodiment may include a deposition metal layer BEMC-2, which is disposed on the side and bottom surfaces of the first substrate BBS1 and the top and side surfaces of the second pad BPD2. The deposition metal layer BEMC-2 may be connected (e.g., electrically connected) to the second pad BPD2.

The second adhesive layer BAL2 may be attached to a side surface of the deposition metal layer BEMC-2. The side surface of the deposition metal layer BEMC-2 may be attached to the second contact pad BDCB_PD by the second adhesive layer BAL2.

A second conductive layer BCD2-2 may be disposed on bottom and side surfaces of the deposition metal layer BEMC-2, a bottom surface of the second adhesive layer BAL2, and the side surface of the second contact pad BDCB_PD. The second conductive layer BCD2-2 may be in contact with the bottom surface and the side surface of the deposition metal layer BEMC-2, the bottom surface of the second adhesive layer BAL2, and the side surface of the second contact pad BDCB_PD. The second conductive layer BCD2-2 may connect (e.g., electrically connect) the deposition metal layer BEMC-2 to the second contact pad BDCB_PD.

The second pad BPD2 may be connected (e.g., electrically connected) to the second contact pad BDCB_PD through the deposition metal layer BEMC-2 and the second conductive layer BCD2-2.

According to an embodiment of the present disclosure, a connection area between the second pad BPD2 and the second contact pad BDCB_PD may be increased, and in this case, resistance between the second pad BPD2 and the second contact pad BDCB_PD may be reduced and thereby reliability in a signal transmission therebetween may be improved.

Figure 19:
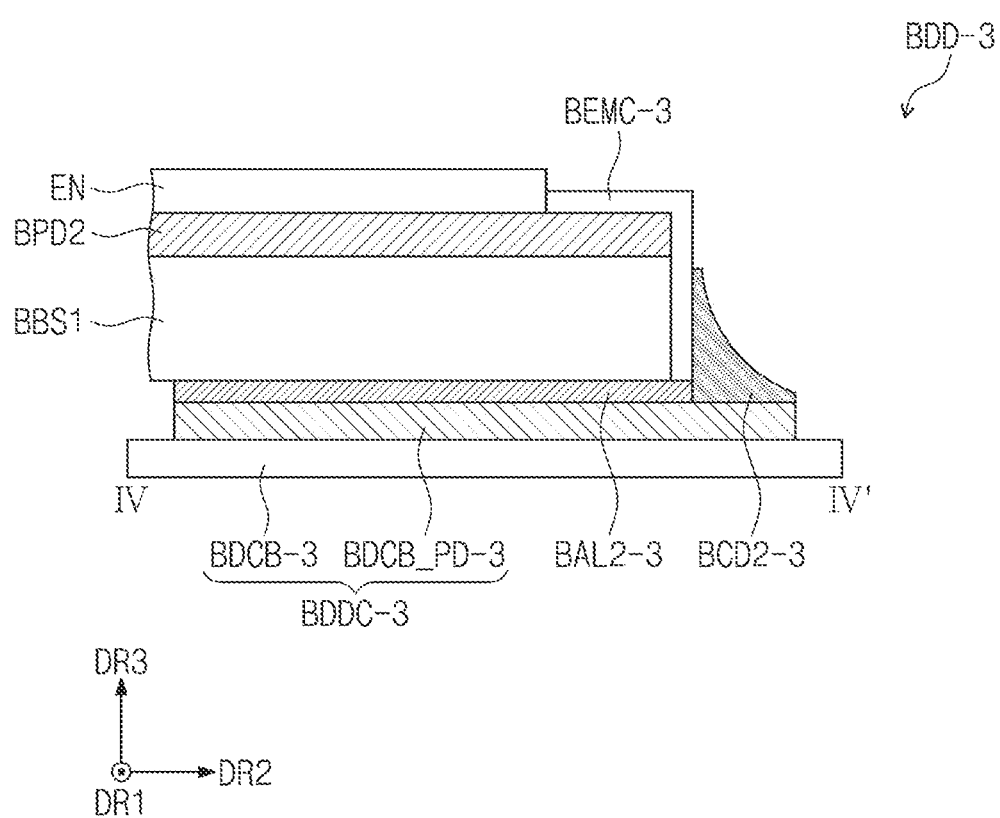
FIG. 19 is a cross-sectional view taken along the line IV-IV' of FIG. 15, according to other embodiment of the present disclosure.

FIG. 19 is a cross-sectional view taken along the line IV-IV' of FIG. 15, according to other embodiment of the present disclosure. In the following description of FIG. 19, an element previously described with reference to FIGS. 15 and 16 may be identified by the same reference number and a redundant description thereof may not be repeated for the sake of brevity.

Referring to FIG. 19, a display device BDD-3 according to the present embodiment may include a deposition metal layer BEMC-3, which is disposed on the side surface of the first substrate BBS1 and the side and top surfaces of the second pad BPD2. The deposition metal layer BEMC-3 may be connected (e.g., electrically connected) to the second pad BPD2.

A second adhesive layer BAL2-3 may be attached to a bottom surface of the first substrate BBS1 and a bottom surface of the deposition metal layer BEMC-3.

A second circuit film BDDC-3 may be disposed below the first substrate BBS1. A second contact pad BDCB_PD-3 of the second circuit film BDDC-3 may be disposed on a display circuit board BDCB-3.

The bottom surface of the first substrate BBS1 and the bottom surface of the deposition metal layer BEMC-3 may be joined to (e.g., bonded to) a top surface of the second contact pad BDCB_PD-3 by the second adhesive layer BAL2-3.

A second conductive layer BCD2-3 may be disposed on a side surface of the deposition metal layer BEMC-3, a side surface of the second adhesive layer BAL2-3, and a top surface of the second contact pad BDCB_PD-3. The second conductive layer BCD2-3 may be in contact with the side surface of the deposition metal layer BEMC-3, the side surface of the second adhesive layer BAL2-3, and the second contact pad BDCB_PD-3. The second conductive layer BCD2-3 may connect (e.g., electrically connect) the deposition metal layer BEMC-3 to the second contact pad BDCB_PD-3.

The second pad BPD2 may be connected (e.g., electrically connected) to the second contact pad BDCB_PD-3 through the deposition metal layer BEMC-3 and the second conductive layer BCD2-3.

According to an embodiment of the present disclosure, a connection area between the second pad BPD2 and the second contact pad BDCB_PD-3 may be increased, and in this case, resistance between the second pad BPD2 and the second contact pad BDCB_PD-3 may be reduced and thereby reliability in a signal transmission therebetween may be improved.

According to an embodiment of the present disclosure, in a process of forming a first conductive layer, which is used to connect pads of an input sensing portion and pads of a circuit film, the first conductive layer may be formed (e.g., locally formed) by a spraying process. Thus, process time and process cost may be reduced.

Although embodiments of the present disclosure have been described, it is understood that the present disclosure should not be limited to these embodiments but various suitable changes and modifications can be made by one ordinary skilled in the art within the spirit and scope of the present disclosure as set forth in the following claims and their equivalents.

What is claimed is:

1. A display device comprising:
   a display panel comprising a first substrate and a second substrate;
   a first pad connected to a sensing electrode on the second substrate;
   a first circuit film on a side surface of the display panel, electrically connected to the first pad, and comprising a first contact pad;
   a first conductive layer electrically connecting the first pad to the first contact pad; and
   a protection layer on the first conductive layer.

2. The display device of claim 1, wherein the first conductive layer is on the first pad, and the protection layer is on the first pad, the first conductive layer, and the first contact pad to cover the first conductive layer.

3. The display device of claim 1, wherein the first conductive layer comprises a metal powder.

4. The display device of claim 1, further comprising a first adhesive layer between the display panel and the first contact pad,
   wherein the first conductive layer is between the first pad and the first contact pad, the first conductive layer being on the first adhesive layer.

5. The display device of claim 4, wherein the first conductive layer is in contact with a top surface of the first pad,
   wherein a top surface of the first adhesive layer is between the first pad and the first contact pad, and
   wherein a side surface of the first contact pad faces a side surface of the first pad.

6. The display device of claim 1, wherein the first contact pad faces the side surface of the display panel, and
   wherein the first contact pad protrudes upwardly relative to the second substrate.

7. The display device of claim 6, wherein a side surface of the first pad overlaps the side surface of the display panel in a plan view.

8. The display device of claim 1, wherein a thickness of the first conductive layer increases along a direction from the first pad toward the first contact pad.

9. The display device of claim 1, further comprising:
   a second circuit film comprising a second contact pad facing a side surface of the first substrate;
   a second pad on the first substrate;
   a second adhesive layer between the side surface of the first substrate and the second contact pad; and
   a second conductive layer on the second pad and the second adhesive layer, the second conductive layer electrically connecting the second pad to the second contact pad.

10. The display device of claim 1, wherein a top surface of the first contact pad is below a top surface of the second substrate.

11. The display device of claim 1, wherein on a plane, a side surface of the first pad is spaced from a side surface of the second substrate, and
   wherein the second substrate has an inclined surface connecting the side surface of the second substrate to the side surface of the first pad.

12. The display device of claim 11, wherein the first conductive layer covers the side surface of the first pad and the inclined surface of the second substrate.

13. The display device of claim 1, wherein a side surface of the first pad is spaced from a side surface of the second substrate on a plane, and
   wherein the second substrate has a curved surface connecting the side surface of the second substrate to the side surface of the first pad.

14. The display device of claim 13, wherein the first conductive layer covers the side surface of the first pad and the curved surface of the second substrate.

15. The display device of claim 1, further comprising:
   a second circuit film comprising a second contact pad facing a side surface of the first substrate;
   a deposition metal layer on the side surface of the first substrate and on a bottom surface of the first substrate adjacent to the side surface of the first substrate;
   a second adhesive layer between the deposition metal layer and the second contact pad; and
   a second conductive layer below the deposition metal layer, the second conductive layer electrically connecting the deposition metal layer to the second contact pad.

16. The display device of claim 1, further comprising a deposition metal layer on the first pad, the deposition metal layer being extended to a bottom surface of the display panel along the side surface of the display panel,
   wherein the first conductive layer is below the deposition metal layer, the first conductive layer electrically connecting the first pad to the first contact pad.

17. The display device of claim 1, further comprising:
   a second circuit film below the first substrate, the second circuit film comprising a second contact pad protruding outwardly relative to a side surface of the first substrate;
   a deposition metal layer on the side surface of the first substrate; and
   a second conductive layer on the deposition metal layer and on the second contact pad to electrically connect the deposition metal layer to the second contact pad.

18. The display device of claim 1, further comprising a deposition metal layer on the first pad, the deposition metal layer being extended to the side surface of the display panel,
   wherein the first circuit film is below the first substrate,
   wherein the first contact pad is outwardly extended relative to a side surface of the first substrate, and
   wherein the first conductive layer is on the deposition metal layer and the first contact pad.

19. The display device of claim 1, the first conductive layer is on the first pad and the first contact pad.

20. The display device of claim 1, wherein a thickness of the first conductive layer decreases along a direction from the first pad toward the first contact pad.

* * * * *